(12) United States Patent
Nomura

(10) Patent No.: US 7,084,977 B2
(45) Date of Patent: Aug. 1, 2006

(54) EXPOSURE APPARATUS AND METHOD OF MEASURING MUELLER MATRIX OF OPTICAL SYSTEM OF EXPOSURE APPARATUS

(75) Inventor: Hiroshi Nomura, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 46 days.

(21) Appl. No.: 10/959,500

(22) Filed: Oct. 7, 2004

(65) Prior Publication Data
US 2005/0105087 A1    May 19, 2005

(30) Foreign Application Priority Data
Oct. 7, 2003    (JP) ............... 2003-348131

(51) Int. Cl.
*G01J 4/00* (2006.01)

(52) U.S. Cl. ...................................... 356/364

(58) Field of Classification Search ..................... None
See application file for complete search history.

(56) References Cited

U.S. PATENT DOCUMENTS

| 5,072,126 A | * | 12/1991 | Progler ........................ 250/548 |
| 6,208,415 B1 | | 3/2001 | De Boer et al. |
| 6,266,141 B1 | * | 7/2001 | Morita ......................... 356/365 |
| 6,473,179 B1 | | 10/2002 | Wang et al. |
| 6,844,972 B1 | * | 1/2005 | McGuire, Jr. ............... 359/494 |

* cited by examiner

*Primary Examiner*—Tu T. Nguyen
(74) *Attorney, Agent, or Firm*—Finnegan, Henderson, Farabow, Garrett & Dunner, L.L.P.

(57) ABSTRACT

A method is provided for measuring Mueller Matrix of an optical system of an exposure apparatus. Light flux from a light source is serially converted into any of a plurality of polarized light beams perpendicular to each other on Poincare sphere and is output. This polarized light beam is injected into a projection optical system or the like to be converted into a converted polarized light beam based on Mueller matrix of each optical system. With a linear polarizer or a linear phase retarder being properly inserted into an optical path of the converted polarized light beam, a light intensity is measured. Stokes parameters of the converted polarized light beam are calculated based on the measured light intensity.

19 Claims, 5 Drawing Sheets

EXPOSURE APPARATUS AND METHOD OF MEASURING MUELLER MATRIX OF OPTICAL SYSTEM OF EXPOSURE APPARATUS

CROSS-REFERENCE TO PRIOR APPLICATION

This application is based upon and claims the benefit of priority from the prior Japanese Patent Application No. 2003-348131, filed on Oct. 7, 2003, the entire content of which is incorporated herein by reference.

BACKGROUND OF THE INVENTION

1. Field of the Invention

The present invention relates to an exposure apparatus and a method of measuring Mueller Matrix of an optical system of the exposure apparatus.

2. Description of the Related Art

With increased requirements for smaller sized semiconductor integrated circuits, exposure light with a shorter wavelength is also required for an exposure apparatuses. Lasers such as an ArF excimer laser (193 nm) and an F2 laser (157 nm) come into practical use at present. For exposure light with such a shorter wavelength, the optical system often includes an optical member (such as lens) made of materials with good transmittance such as calcium fluoride (fluorite). The fluorite, however, has a large birefringence, and may generate wave-front aberration or divide the wave front in two to reduce the capability of coherency, depending on the polarization direction of the incident light. For the design of an optical system with a smaller aberration, the number of the birefringence of the optical system needs to be known.

The birefringence of a planar optical member can generally be shown by identifying the direction (azimuth) $\theta$ and phase difference $\Delta$. This method is not suitable to express the birefringence of an optical system with a plurality of optical members having curved surfaces (such as lenses). Jones Matrix and Mueller Matrix are thus generally used to express the characteristics of the optical system having the birefringence.

Jones Matrix is a 2×2 matrix to express the optical characteristics of an optical element through which the completely-polarized light beam passes, which can be expressed by Jones Vector. Jones Vector can express the electric vector $(E)=(E_x, E_y)$ with amplitudes $a_x$, $a_y$, and phase difference $\delta$ between $E_x$ and $E_y$, as follows.

$$E = \begin{pmatrix} E_x \\ E_y \end{pmatrix} = e^{i\omega t}\begin{pmatrix} a_x e^{i\varphi_x} \\ a_y e^{i\varphi_y} \end{pmatrix} = e^{i(\omega t + \varphi_x)}\begin{pmatrix} a_x \\ a_y e^{i\delta} \end{pmatrix} \quad \text{[Equation 1]}$$

Jones Matrix can express the characteristics of an optical element through which the completely polarized light beam, which can be expressed by such Jones Vector, passes to undergo any conversion. For example, Jones matrix of a polarizer with azimuth $\theta=0$ degrees can be expressed as follows.

$$P(0) = \begin{bmatrix} 1 & 0 \\ 0 & 0 \end{bmatrix} \quad \text{[Equation 2]}$$

Jones Matrix can only handle the completely polarized light beam (including no non-polarized component) and cannot handle the partially polarized light beam including the non-polarized component. The Mueller Matrix, which can also handle the non-polarized component, is thus suitable to express the birefringence characteristics of the optical system including the fluorite lens, which certainly provides the non-polarized component. Mueller Matrix is a 4×4 matrix to express the optical characteristics of an optical element through which is passed the partially polarized light beam expressed by Stokes parameters.

With $s_0$ being the total intensity of the light, $s_1$ being the intensity of the 0 degrees linearly polarized component, $s_2$ being the intensity of the 45 degrees linearly polarized component, and $s_3$ being the intensity of the clockwise circularly polarized component, Stokes parameters can be expressed as follows, particularly for the completely polarized light beam.

$$S = \begin{pmatrix} s_0 \\ s_1 \\ s_2 \\ s_3 \end{pmatrix} = \begin{pmatrix} a_x^2 + a_y^2 \\ a_x^2 - a_y^2 \\ 2a_x a_y \cos\delta \\ 2a_x a_y \sin\delta \end{pmatrix} \quad \text{[Equation 3]}$$

Stokes parameters express the non-polarized component with $(s_0^2-(s_1^2+s_2^2+s_3^2))^{1/2}$. Stokes parameters can, thus, also express the partially polarized light beam including the non-polarized component.

Mueller Matrix can express the characteristics of an optical element through which the partially polarized light beam, which is expressed by such Stokes parameters, may pass to undergo any conversion. For example, Mueller Matrix ($P_0$) of a polarizer with azimuth $\theta=0$ degrees can be expressed as follows. Mueller matrix of azimuth $\theta$ is hereafter expressed by the symbol ($P\theta$).

$$P_0 = \frac{1}{2}\begin{pmatrix} 1 & 1 & 0 & 0 \\ 1 & 1 & 0 & 0 \\ 0 & 0 & 0 & 0 \\ 0 & 0 & 0 & 0 \end{pmatrix} \quad \text{[Equation 4]}$$

Measurement of this Mueller Matrix can facilitate the calculation about how the optical element converts the polarization state for every types of polarized light beam. One known system for measuring Mueller matrix of a single optical member is a Mueller polarimeter described in Japanese application patent laid-open publication 2000-502461 (pp. 19–22, FIGS. 1 to 4 or the like, this reference is hereafter referred to as "patent literature 1").

The Mueller polarimeter described in the patent literature 1 or the like, however, can only measure a single optical member, and cannot measure an optical system or the like including a plurality of optical members, such as those built in an exposure apparatus or the like.

The exposure apparatuses have recently projected exposure light with a particular polarization direction for purposes such as a higher contrast of the projected pattern. For considerable birefringence or non-polarized component that occurs in the projection optical system, the birefringence or the degree of polarization must quantitatively evaluated and the resultant evaluation results must be taken into account to select the polarization direction of the exposure light. Otherwise, the desired polarization direction of the exposure light may not be provided. The characteristics of the projection optical system or the like of the exposure apparatus can be affected by aged deterioration or contamination or the like. There is, therefore, a need for measurement of Mueller matrix of the projection optical system or the like of the exposure apparatus without disassembling the exposure apparatus.

SUMMARY OF THE INVENTION

An exposure apparatus according to an embodiment of the present invention includes: a light source generating light flux; an illumination optical system introducing the light flux to a photomask; and a projection optical system projecting an image of a mask pattern onto the object to be exposed; the exposure apparatus further comprising: a first polarization conversion system serially converting the light flux into any of a plurality of polarized light beams perpendicular to each other on Poincare sphere and outputting the polarized light beam; a light intensity detection section, which is disposed near an imaging position at which the projection optical system forms the image of the mask pattern, for detecting a light intensity of a converted polarized light beam obtained from the polarized light beam passing through the illumination optical system, the photomask, and the projection optical system; a second polarization conversion system including a linear polarizer and a linear phase retarder, which is inserted in an optical path of the converted polarized light beam; a parameter calculation section for, by switching the linear polarizer between azimuths and switching the linear phase retarder between being inserted into and removed from the optical path or between azimuths, obtaining a plurality of data on the light intensity detected by the light intensity detection section, and for calculating Stokes parameters of the converted polarized light beam based on the plurality of data on the light intensity obtained; and a Mueller Matrix calculation section for calculating Mueller matrix of an optical system existing before the position at which the second polarization conversion system is inserted, based on the calculated Stokes parameters of the converted polarized light beam and the Stokes parameters of the polarized light beam output from the first polarization conversion system.

A method of measuring Mueller matrix of an optical system of an exposure apparatus according an embodiment of this invention is a method of measuring Mueller matrix of an optical system of an exposure apparatus in which light flux from a light source is introduced through an illumination optical system to a photomask, and an object to be exposed is exposed via a projection optical system to a mask pattern formed on the photomask, comprising: a polarization conversion step of serially converting the light flux into a plurality of polarized light beams perpendicular to each other on Poincare sphere; a step of injecting the polarized light beam into the illumination optical system, the photomask or the projection optical system to convert the polarized light beam into a converted polarized light beam based on Mueller matrix of the optical systems; a switching step of inserting a linear polarizer into an optical path of the converted polarized light beam, switching the linear polarizer to a proper azimuth, inserting properly a linear phase retarder, in addition to the linear polarizer, into the optical path of the converted polarized light beam at a predetermined azimuth; a light intensity measurement step of measuring a light intensity of the converted polarized light beam near an imaging position at which an image of the mask pattern is formed for each condition switched in the switching step; a parameter calculation step of calculating Stokes parameters of the converted polarized light beam based on a plurality of light intensity obtained; and a Mueller Matrix calculation step of calculating Mueller Matrix of an optical system upstream of the linear polarizer or the linear phase retarder, based on the calculated Stokes parameters of the converted polarized light beam and Stokes parameters of the polarized light beam obtained in the polarization conversion step.

DETAILED DESCRIPTION OF THE INVENTION

Embodiments of the present invention will be described in more detail below with reference to the accompanying drawings.

THE FIRST EMBODIMENT

Figure 1:
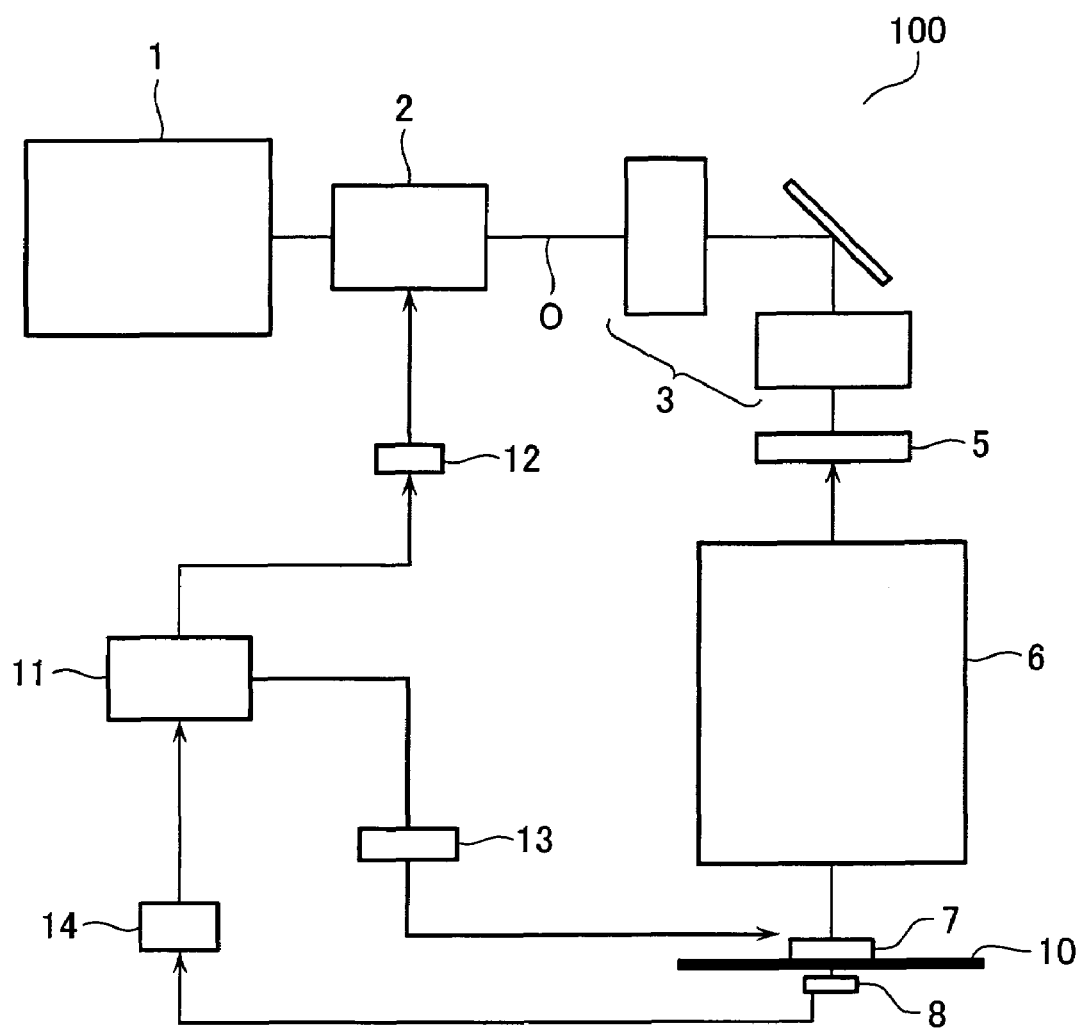
FIG. 1 shows a configuration of the exposure apparatus 100 according to the first and second embodiments of the present invention.

FIG. 1 shows a configuration of the exposure apparatus 100 according to the first embodiment of the present invention.

As shown in FIG. 1, this exposure apparatus 100 comprises a light source system 1, the first polarization conversion system 2, an illumination optical system 3, a photomask 5, a projection optical system 6, the second polarization conversion system 7, a photodetector 8, an arithmetic controller 11, a driver 12, a driver 13, and an A/D converter 14. In FIG. 1, the 10 depicts an imaging surface at which an object to be exposed such as a wafer is mounted. The light source system 1, such as a laser light source system, emits exposure light that has a predetermined wavelength and is polarized in a predetermined direction. The light source system 1 is here assumed to emit exposure light that is linearly polarized in a horizontal direction, i.e., in a 0 degrees direction. The illumination optical system 3, photomask 5, and projection optical system 6 are similar to those well known, their description is thus omitted here.

The first polarization conversion system 2 and the second polarization conversion system 7 serve to change the polarization state of the light flux passing through the systems for measurement the Mueller Matrix of the projection optical system 6 or the like. The first polarization conversion system 2 and the second polarization conversion system 7 are thus inserted in the optical system of the exposure apparatus 100 only during measurement of Mueller Matrix of the projection optical system 6 or the like and are usually removed from the optical path (for example, during the exposure operation). Instead of being removed from the optical path, the systems 2, 7 can be set to make zero changes to the polarization state of the light flux through the systems.

Figure 2:
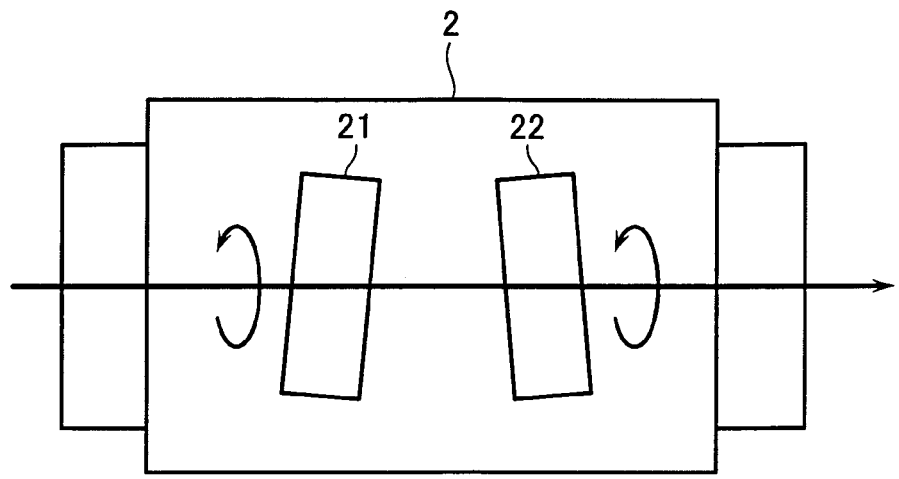
FIG. 2 shows a configuration of the first polarization conversion system 2.

The first polarization conversion system 2 is to convert the polarization direction of the exposure light emitted from the light source system 1. The system 2 includes the half-wave plate 21 and the quarter-wave plate 22, as shown in FIG. 2. The half-wave plate 21 is rotatably held about the optical axis O of the illumination optical system 3 to make it possible to change its azimuth in 22.5 degrees increments. The half-wave plate 21 may be replaced with the combination of a depolarizing plate such as a Hanle depolarizer and a linear polarizer with a variable azimuth. The quarter-wave plate 22 is also rotatably held about the optical axis O of the illumination optical system 3 to make it possible to change its azimuth in 45 degrees increments. Specifically, the azimuths of the half-wave plate 21 and quarter-wave plate 22 can be set as shown in the left hand side of the [Table 1] below to convert the polarization directions of the polarized light beams $(S^{(i)})(i=1$ to $6)$ passing through the first polarization conversion system 2 into the directions as shown in the right hand side of the [Table 1]. For the circularly polarized light beam emitted from the first polarization conversion system 2, the quarter-wave plate 22 is inserted at 45 degrees azimuth relative to the polarization direction of the light flux passing through the linear polarizer 21, and is otherwise inserted at an azimuth matching the polarization direction of the light flux passing through the linear polarizer 21. The driver 12 controls the rotation of the half-wave plate 21 and quarter-wave plate 22 based on control signals from the arithmetic controller 11. The half-wave plate 21 and quarter-wave plate 22 are disposed in a truncated chevron shape in which they are slightly tilted relative to the optical axis, in order to prevent the light from returning to the light source system 1.

TABLE 1

| AZIMUTH of HALF-WAVE PLATE 21 (degrees) | QUARTER-WAVE PLATE 22 | POLARIZATION STATE |
|---|---|---|
| 0 | 0 degrees AZIMUTH OR REMOVED | S(1) 0 degrees LINEAR POLARIZATION |
| 22.5 | +/−45 degrees AZIMUTH OR REMOVED | S(2) 45 degrees LINEAR POLARIZATION |
| 0 | 45 degrees AZIMUTH | S(3) CLOCKWISE CIRCULAR POLARIZATION |
| 45 | 0 degrees AZIMUTH OR REMOVED | S(4) 90 degrees LINEAR POLARIZATION |
| −22.5 | +/−45 degrees AZIMUTH OR REMOVED | S(5) −45 degrees LINEAR POLARIZATION |
| 45 | 45 degrees AZIMUTH | S(6) COUNTER-CLOCKWISE CIRCULAR POLARIZATION |

Figure 3:
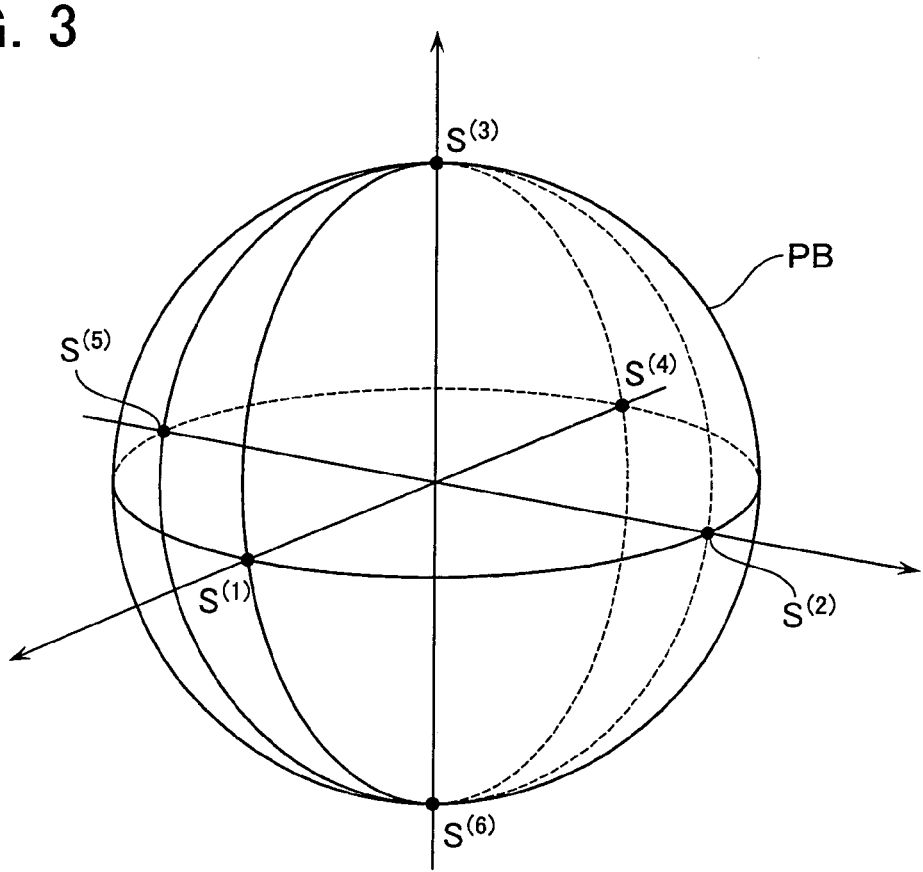
FIG. 3 shows the polarized light beams ($S^{(1)}$), ($S^{(2)}$), ($S^{(3)}$), ($S^{(4)}$), ($S^{(5)}$), and ($S^{(6)}$) emitted from the first polarization conversion system 2 that are expressed on Poincare sphere PB.

In this embodiment, the first polarization conversion system 2 thus emits polarized light beams $(S^{(1)})$, $(S^{(2)})$, $(S^{(3)})$, $(S^{(4)})$, $(S^{(5)})$, and $(S^{(6)})$, which are expressed on the Poincare sphere PB by the six intersecting points between the Poincare sphere PB and the coordinate axes X, Y, and Z, as shown in FIG. 3. Stokes vector express the polarized light beams $(S^{(1)})$, $(S^{(2)})$, $(S^{(3)})$, $(S^{(4)})$, $(S^{(5)})$, and $(S^{(6)})$ by the following equation [5].

$$S^{(1)} = \begin{pmatrix} 1 \\ 1 \\ 0 \\ 0 \end{pmatrix}, S^{(2)} = \begin{pmatrix} 1 \\ 0 \\ 1 \\ 0 \end{pmatrix}, S^{(3)} = \begin{pmatrix} 1 \\ 0 \\ 0 \\ 1 \end{pmatrix} \quad \text{[Equation 5]}$$

$$S^{(4)} = \begin{pmatrix} 1 \\ -1 \\ 0 \\ 0 \end{pmatrix}, S^{(5)} = \begin{pmatrix} 1 \\ 0 \\ -1 \\ 0 \end{pmatrix}, S^{(6)} = \begin{pmatrix} 1 \\ 0 \\ 0 \\ -1 \end{pmatrix}$$

The polarized light beams $(S^{(1)})$, $(S^{(2)})$, $(S^{(3)})$, $(S^{(4)})$, $(S^{(5)})$, and $(S^{(6)})$ do not need to be the combination as shown in FIG. 3 and may be any combination of light perpendicular to each other on the Poincare sphere PB and light symmetric therewith about the origin. For example, an elliptically polarized light beam may be used.

Figure 4:
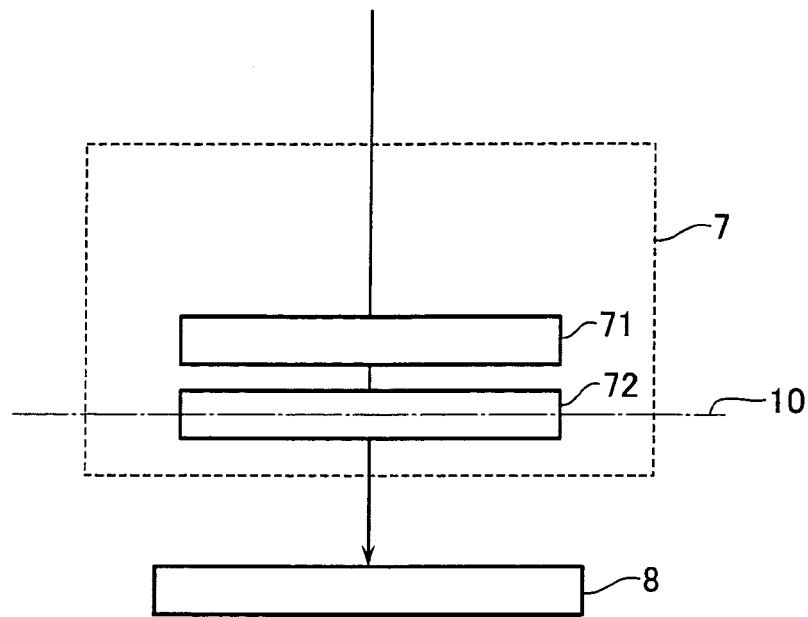
FIG. 4 shows a configuration of the second polarization conversion system 7.
Figure 5:
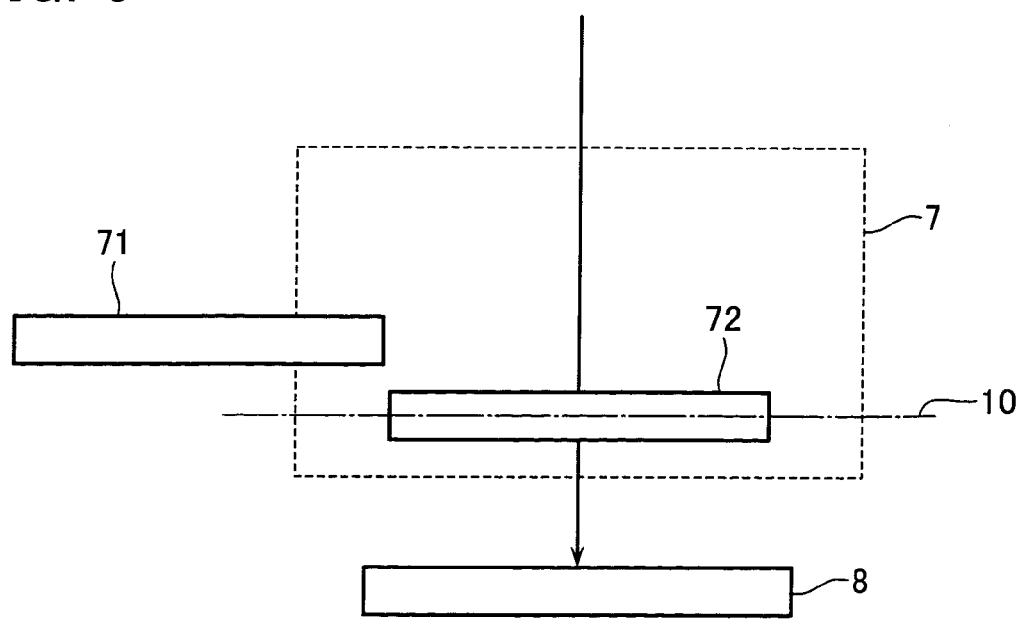
FIG. 5 shows another configuration of the second polarization conversion system 7.

The second polarization conversion system 7 includes the quarter-wave plate 71 and linear polarizer 72, as shown in FIG. 4. The quarter-wave plate 71 has its azimuth fixed at −45 degrees and is held to be easily inserted into or removed from the optical path as shown in FIG. 5. The linear polarizer 72 is rotatably held about the optical axis O and can change its azimuth in 45 degrees increments. The second polarization conversion system 7 itself can easily be inserted into or removed from the optical path of the exposure apparatus 100. The system 7 can be inserted at different positions depending on the position of the optical system to be measure or the like. The driver 13 controls inserting and taking out the quarter-wave plate 71 and the rotation of the linear polarizer 72 based on control signals from the arithmetic controller 11.

It is supposed here that for the second polarization conversion system 7 being absent, the above-described polarized light beams $(S^{(1)})$, $(S^{(2)})$, $(S^{(3)})$, $(S^{(4)})$, $(S^{(5)})$, and $(S^{(6)})$ pass through the projection optical system 6 for conversion into polarized light beams (converted polarized light beams), $(S^{(1)'})$, $(S^{(2)'})$, $(S^{(3)'})$, $(S^{(4)'})$, $(S^{(5)'})$, and $(S^{(6)'})$, respectively.

Figure 8:
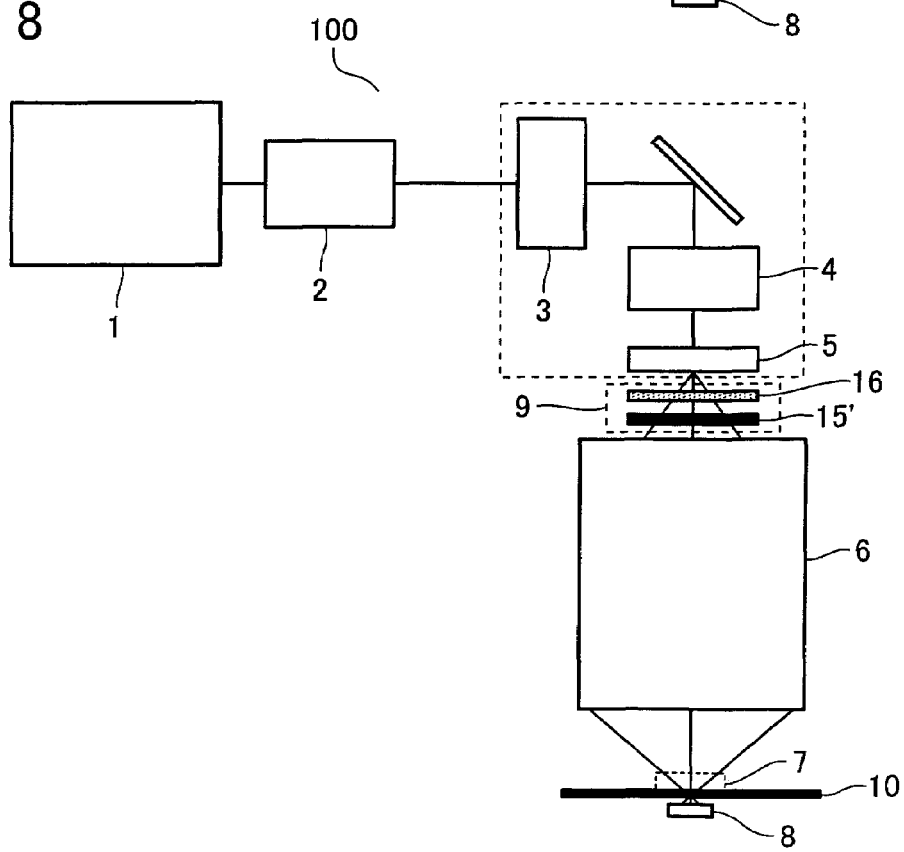
FIG. 8 shows a configuration of the exposure apparatus 100 according to the fourth embodiment of the present invention.
Figure 1:
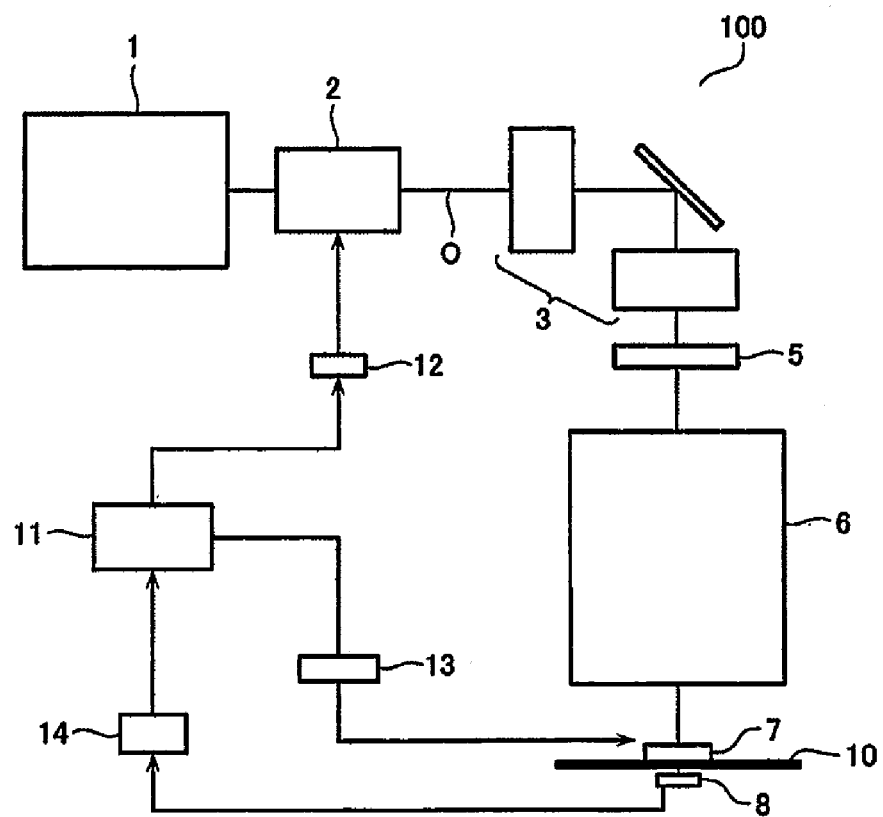

In this embodiment, the quarter-wave plate 71 is inserted into and removed from the optical system and the azimuth of the linear polarizer 72 is changed, as described below, to change the received conditions of the converted polarized light beams $(S^{(1)'})$, $(S^{(2)'})$, $(S^{(3)'})$, $(S^{(4)'})$, $(S^{(5)'})$, and $(S^{(6)'})$ on the photodetector 8. The photodetector 8 is disposed near the imaging surface 10 on which the projection optical system 6 forms the image of the mask pattern 5, as shown in FIG. 8. The change of the received conditions of the light can allow the polarization state of the converted polarized light beams $(S^{(1)'})$, $(S^{(2)'})$, $(S^{(3)'})$, $(S^{(4)'})$, $(S^{(5)'})$, and $(S^{(6)'})$ to be detected as Stokes vector as described below. The detection signals from the photodetector 8 are input through the A/D converter 14 into the arithmetic controller 11. Based on these detection signals and on the control conditions of the first polarization conversion system 2 and second polarization conversion system 7 during the detection, the arithmetic controller 11 can calculate Stokes parameters of the converted polarized light beam (S') and determine Mueller Matrix of the projection optical system 6 or the like.

Mueller Matrix (M) showing the optical characteristics of the projection optical system 6 can express the relationship between the polarized light beam (S) and the converted polarized light beam (S') as follows.

$$S' = M \times S \quad \text{[Equation 6]}$$

$$\begin{pmatrix} s'_0 \\ s'_1 \\ s'_2 \\ s'_3 \end{pmatrix} = \begin{pmatrix} m_{00} & m_{01} & m_{02} & m_{03} \\ m_{10} & m_{11} & m_{12} & m_{13} \\ m_{20} & m_{21} & m_{22} & m_{23} \\ m_{30} & m_{31} & m_{32} & m_{33} \end{pmatrix} \begin{pmatrix} s_0 \\ s_1 \\ s_2 \\ s_3 \end{pmatrix}$$

The polarized light beams ($S^{(1)'}$), ($S^{(2)'}$), ($S^{(3)'}$), ($S^{(4)'}$), ($S^{(5)'}$), and ($S^{(6)'}$) which are detected as Stokes vectors can thus allow elements of each column of Mueller Matrix (M) to be calculated by the following equations [7] to [10].

$$\begin{pmatrix} m_{00} \\ m_{10} \\ m_{20} \\ m_{30} \end{pmatrix} = \frac{S^{(1)'} + S^{(2)'} + S^{(3)'} + S^{(4)'} + S^{(5)'} + S^{(6)'}}{6} \quad \text{[Equation 7]}$$

$$\begin{pmatrix} m_{01} \\ m_{11} \\ m_{21} \\ m_{31} \end{pmatrix} = \frac{S^{(1)'} - S^{(4)'}}{2} \quad \text{[Equation 8]}$$

$$\begin{pmatrix} m_{02} \\ m_{12} \\ m_{22} \\ m_{32} \end{pmatrix} = \frac{S^{(2)'} - S^{(5)'}}{2} \quad \text{[Equation 9]}$$

$$\begin{pmatrix} m_{03} \\ m_{13} \\ m_{23} \\ m_{33} \end{pmatrix} = \frac{S^{(3)'} - S^{(6)'}}{2} \quad \text{[Equation 10]}$$

The procedure for measuring Mueller Matrix(M) of the projection optical system 6 in this embodiment will now be described.

First, after adjusting the azimuths of the half-wave plate 21 and quarter-wave plate 22 of the first polarization conversion system 2, the polarized light beams ($S^{(i)}$)(i=1 to 6) is emitted through the projection optical system 6 with unknown Mueller Matrix (M) for conversion into the converted polarized light beams ($S^{(i)'}$) which are detected by the photodetector 8. The second polarization conversion system 7 is disposed right after the projection optical system 6 to be measured, as shown in FIG. 1.

In this state, the second polarization conversion system 7 is first arranged to have the quarter-wave plate 71 removed from the optical path and the linear polarizer 72 is set at 0 degrees and 90 degrees azimuths, and the detection signal of the photodetector 8 is obtained at each azimuth. Mueller Matrix ($P_0$) of the linear polarizer with 0 degrees azimuth and Mueller Matrix ($P_{90}$) of the linear polarizer with 90 degrees azimuth can be expressed by the above-described equation [4] and the following equation [11], respectively.

$$P_{90} = \frac{1}{2}\begin{pmatrix} 1 & -1 & 0 & 0 \\ -1 & 1 & 0 & 0 \\ 0 & 0 & 0 & 0 \\ 0 & 0 & 0 & 0 \end{pmatrix} \quad \text{[Equation 11]}$$

For the linear polarizer 72 with its azimuth set at 0 degrees and 90 degrees, Stokes parameters of the polarized light beams ($P_0S'$) and ($P_{90}S'$) on the photodetector 8 can thus be expressed by the following equations [12], [13].

$$P_0 S' = \frac{1}{2}\begin{pmatrix} 1 & 1 & 0 & 0 \\ 1 & 1 & 0 & 0 \\ 0 & 0 & 0 & 0 \\ 0 & 0 & 0 & 0 \end{pmatrix}\begin{pmatrix} s'_0 \\ s'_1 \\ s'_2 \\ s'_3 \end{pmatrix} = \frac{1}{2}\begin{pmatrix} s'_0 + s'_1 \\ s'_0 + s'_1 \\ 0 \\ 0 \end{pmatrix} \quad \text{[Equation 12]}$$

$$P_{90} S' = \frac{1}{2}\begin{pmatrix} 1 & -1 & 0 & 0 \\ -1 & 1 & 0 & 0 \\ 0 & 0 & 0 & 0 \\ 0 & 0 & 0 & 0 \end{pmatrix}\begin{pmatrix} s'_0 \\ s'_1 \\ s'_2 \\ s'_3 \end{pmatrix} = \frac{1}{2}\begin{pmatrix} s'_0 + s'_1 \\ -s'_0 + s'_1 \\ 0 \\ 0 \end{pmatrix} \quad \text{[Equation 13]}$$

The light intensity of the polarized light beams ($P_0S'$) and ($P_{90}S'$) measured by the photodetector 8 can be expressed by the following equations (14) and (15), respectively.

$$I(P_0 S') = \frac{s'_0 + s'_1}{2} \quad \text{[Equation 14]}$$

$$I(P_{90} S') = \frac{s'_0 - s'_1}{2} \quad \text{[Equation 15]}$$

The $s_0'$, $s_1'$ can be determined as follows.

$$s_1' = I(P_0 S') - I(P_{90} S') \quad \text{[Equation 16]}$$

$$s_0' = I(P_0 S') + I(P_{90} S') \quad \text{[Equation 17]}$$

The $s_2'$, $s_0'$ can also be calculated by arranging the second polarization conversion system 7 to have the quarter-wave plate 71 removed from the optical path, and the linear polarizer 72 set at 45 degrees and −45 degrees (or 135 degrees) azimuth, and by obtaining the detection signal of the photodetector 8 at each azimuth. Mueller Matrix ($P_{45}$) of the linear polarizer with 45 degrees azimuth and Mueller Matrix ($P_{-45}$) of the linear polarizer with −45 degrees azimuth can be expressed by the following equations [18] and [19], respectively.

$$P_{45} = \frac{1}{2}\begin{pmatrix} 1 & 0 & 1 & 0 \\ 0 & 0 & 0 & 0 \\ 1 & 0 & 1 & 0 \\ 0 & 0 & 0 & 0 \end{pmatrix} \quad \text{[Equation 18]}$$

$$P_{-45} = \frac{1}{2}\begin{pmatrix} 1 & 0 & -1 & 0 \\ 0 & 0 & 0 & 0 \\ -1 & 0 & 1 & 0 \\ 0 & 0 & 0 & 0 \end{pmatrix} \quad \text{[Equation 19]}$$

The $s_2'$, $s_0'$ can be determined from the following equations in the same manner as for the $s_1'$, $s_0'$.

$$s_2' = I(P_{45} S') - I(P_{-45} S') \quad \text{[Equation 20]}$$

$$s_0' = I(P_{45} S') + I(P_{-45} S') \quad \text{[Equation 21]}$$

The $s_3'$ can be measured by arranging the second polarization conversion system 7 to have the quarter-wave plate 71 with −45 degrees azimuth inserted thereinto, and the linear polarizer 72 switched between azimuths of 0 degrees and 90 degrees, and by measuring the light intensity of the light received by the photodetector 8 at each azimuth.

Mueller Matrix ($Q_\theta$) of the quarter-wave plate with $\theta$ azimuth can be expressed as follows.

$$Q_\theta = \begin{pmatrix} 1 & 0 & 0 & 0 \\ 0 & \cos^2 2\theta & \sin 2\theta \cos 2\theta & -\sin 2\theta \\ 0 & \sin 2\theta \cos 2\theta & \sin^2 2\theta & \cos 2\theta \\ 0 & \sin 2\theta & -\cos 2\theta & 0 \end{pmatrix} \quad \text{[Equation 22]}$$

Stokes parameters can thus be expressed by the following equations [23], [24] for the exposure light ($P_0 Q_{-45} S'$) and ($P_{90} Q_{-45} S'$) generated from the exposure light (S') passing through the quarter-wave plate 71 with −45 degrees azimuth and the linear polarizer 72 with 0 degrees or 90 degrees azimuth.

$$P_0 Q_{-45} S' = \frac{1}{2}\begin{pmatrix} 1 & 1 & 0 & 0 \\ 1 & 1 & 0 & 0 \\ 0 & 0 & 0 & 0 \\ 0 & 0 & 0 & 0 \end{pmatrix}\begin{pmatrix} 1 & 0 & 0 & 0 \\ 0 & 0 & 0 & 1 \\ 0 & 0 & 1 & 0 \\ 0 & -1 & 0 & 0 \end{pmatrix}\begin{pmatrix} s_0' \\ s_1' \\ s_2' \\ s_3' \end{pmatrix} \quad \text{[Equation 23]}$$

$$= \frac{1}{2}\begin{pmatrix} 1 & 0 & 0 & 1 \\ 1 & 0 & 0 & 1 \\ 0 & 0 & 0 & 0 \\ 0 & 0 & 0 & 0 \end{pmatrix}\begin{pmatrix} s_0' \\ s_1' \\ s_2' \\ s_3' \end{pmatrix}$$

$$= \frac{1}{2}\begin{pmatrix} s_0' + s_3' \\ s_0' + s_3' \\ 0 \\ 0 \end{pmatrix}$$

$$P_{90} Q_{-45} S' = \frac{1}{2}\begin{pmatrix} 1 & -1 & 0 & 0 \\ -1 & 1 & 0 & 0 \\ 0 & 0 & 0 & 0 \\ 0 & 0 & 0 & 0 \end{pmatrix}\begin{pmatrix} 1 & 0 & 0 & 0 \\ 0 & 0 & 0 & 1 \\ 0 & 0 & 1 & 0 \\ 0 & -1 & 0 & 0 \end{pmatrix}\begin{pmatrix} s_0' \\ s_1' \\ s_2' \\ s_3' \end{pmatrix} \quad \text{[Equation 24]}$$

$$= \frac{1}{2}\begin{pmatrix} 1 & 0 & 0 & -1 \\ -1 & 0 & 0 & 1 \\ 0 & 0 & 0 & 0 \\ 0 & 0 & 0 & 0 \end{pmatrix}\begin{pmatrix} s_0' \\ s_1' \\ s_2' \\ s_3' \end{pmatrix}$$

$$= \frac{1}{2}\begin{pmatrix} s_0' - s_3' \\ -s_0' + s_3' \\ 0 \\ 0 \end{pmatrix}$$

The $s_3'$ and $s_0'$ can thus be determined as follow.

$$s_3' = I(P_0 Q_{-45} S') - I(P_{90} Q_{-45} S') \quad \text{[Equation 25]}$$

$$s_0' = I(P_0 Q_{-45} S') + I(P_{90} Q_{-45} S') \quad \text{[Equation 26]}$$

For the elements $s_0'$ to $s_3'$ of Stokes parameters of the converted polarized light beam (S') thus determined, the elements of each column of Mueller Matrix (M) of the projection optical system 6 can be determined from the above-described equations (7) to (10).

In this first embodiment, the first polarization conversion system 2 uses the half-wave plate 21 and quarter-wave plate 22, and the half-wave plate 21 changes its azimuth in 22.5 degrees increments about the optical axis O of the illumination optical system 3 to convert the light beam emitted from the light source system 1 into the desired polarization state. Alternatively, the first polarization conversion system 2 may include a light rotator with variable azimuth in 45 degrees increments and a quarter-wave plate.

In this first embodiment, the second polarization conversion system 7 uses the quarter-wave plate 71, but this is illustrative only and a linear phase retarder may generally be used which can provide a phase difference $\Delta$ between two electric vectors perpendicular to each other.

In this first embodiment, the $s_3'$ is determined by arranging the second polarization conversion system 7 to have the quarter-wave plate 71 with −45 degrees azimuth inserted thereinto and the linear polarizer 72 switched between azimuths of 0 degrees and 90 degrees, but the present invention is not limited to this embodiment. For example, the quarter-wave plate 71 with 90 degrees azimuth may be inserted and the linear polarizer 72 may have its azimuth switched between 45 degrees and −45 degrees.

In the first embodiment, the quarter-wave plate 71 is removed from the optical path if it is unnecessary, but alternatively the quarter-wave plate 71 may be set at the same azimuth as the linear polarizer 72.

Instead of the linear polarizer 72 being switched between different azimuths and the quarter-wave plate 71 being switched between being inserted into and removed from the optical path or between different azimuths, the azimuth of the linear polarizer 72 may be fixed at, for example, 0 degrees and the azimuth of the quarter-wave plate 71 may be changed to measure the light intensity.

THE SECOND EMBODIMENT

The second embodiment of the present invention will now be described.

The first embodiment measures Mueller matrix of the projection optical system 6 along the optical axis O. The second embodiment measures Mueller Matrix distribution in the pupil in the projection optical system 6 by emitting light in various directions in the pupil of the projection optical system 6 through a photomask 5 including a diffraction grating pattern with different periods and directions.

The converted polarized light beam (S') is thus incident at an angle even on the quarter-wave plate 71. The quarter-wave plate may generally have different retardation depending on the incidence angle of the incident light. For the converted polarized light beam (S') incident on the quarter-wave plate 71 at an angle, the quarter-wave plate 71 thus needs to be handled as a general linear polarizer. In this embodiment, the $s_3'$ of the elements of Stokes parameters of the converted polarized light beam (S') is measured with the quarter-wave plate 71 set at two azimuths of −45 degrees and 45 degrees and with the linear polarizer 72 being, for each azimuth, switched between azimuths of 0 degrees and 90 degrees. This makes it possible to measure the $s_3'$ with high accuracy even for the quarter-wave plate 71 having different retardation with the incidence angle of the light.

The elements $s_0'$, $s_1'$, and $s_2'$ of Stokes parameters of the converted polarized light beam (S') can be measured at properly changed azimuths of the linear polarizer 72, as in the first embodiment.

The procedure for measuring the $s_3'$ in this embodiment will be specifically described below.

First, the quarter-wave plate 71 with its azimuth set at 45 degrees is inserted into the optical path, and in this state the linear polarizer 72 is arranged to have its azimuth set at 0 degrees. In this case, if Mueller Matrix is expressed as ($R_{\Delta 45}$) (retardance $\Delta$) for the quarter-wave plate 71 with its azimuth set at 45 degrees on which the converted polarized light beam (S') is incident at an angle, the light passing through the second polarization conversion system 7 ($P_0 R_{\Delta 45} S'$) can be expressed as follows.

$$P_0 R_{\Delta 45} S' = \frac{1}{2}\begin{pmatrix} 1 & 1 & 0 & 0 \\ 1 & 1 & 0 & 0 \\ 0 & 0 & 0 & 0 \\ 0 & 0 & 0 & 0 \end{pmatrix}$$  [Equation 27]

$$\begin{pmatrix} 1 & 0 & 0 & 0 \\ 0 & \cos\Delta & 0 & -\sin\Delta \\ 0 & 0 & 1 & 0 \\ 0 & \sin\Delta & 0 & \cos\Delta \end{pmatrix}\begin{pmatrix} s_0' \\ s_1' \\ s_2' \\ s_3' \end{pmatrix}$$

$$= \frac{1}{2}\begin{pmatrix} s_0' + s_1'\cos\Delta - s_3'\sin\Delta \\ s_0' + s_1'\cos\Delta - s_3'\sin\Delta \\ 0 \\ 0 \end{pmatrix}$$

The light intensity I ($P_0 R_{\Delta 45} S'$) detected by the photodetector 8 can be expressed by the following equation [28].

$$I(P_0 R_{\Delta 45} S') = \frac{1}{2}(s_0' + s_1'\cos\Delta - s_3'\sin\Delta)$$  [Equation 28]

Likewise, for the second polarization conversion system 7 having the quarter-wave plate 71 with its azimuth set at 45 degrees and the linear polarizer 72 with its azimuth set at 90 degrees, the light I ($P_{90} R_{\Delta 45} S'$) detected by the photodetector 8 after passing through the system 7 can be expressed by the following equation [29].

$$I(P_{90} R_{\Delta 45} S') = \frac{1}{2}(s_0' - s_1'\cos\Delta + s_3'\sin\Delta)$$  [Equation 29]

For the quarter-wave plate 71 with its azimuth set at −45 degrees, and the linear polarizer 72 with its azimuth switched between 0 degrees and 90 degrees, the photodetector 8 detects the light having the light intensity expressed by the following equations [30], [31]. ($R_{\Delta -45}$) is Mueller matrix of the quarter-wave plate 71 with its azimuth set at −45 degrees on which the converted polarized light beam (S') is incident at an angle.

$$I(P_0 R_{\Delta -45} S') = \frac{1}{2}(s_0' + s_1'\cos\Delta + s_3'\sin\Delta)$$  [Equation 30]

$$I(P_{90} R_{\Delta -45} S') = \frac{1}{2}(s_0' - s_1'\cos\Delta - s_3'\sin\Delta)$$  [Equation 31]

Therefore, the equation [32] obtained from the equation [30] minus the equation [29], and the $s_1'$ previously measured in the same manner as in the first embodiment, for example, can be used to determine the actual retardance $\Delta$ of the quarter-wave plate 71.

$$s_1' \cos\Delta = I(P_0 R_{\Delta -45} S') - I(P_{90} R_{\Delta 45} S')$$  [Equation 32]

Figure 6:
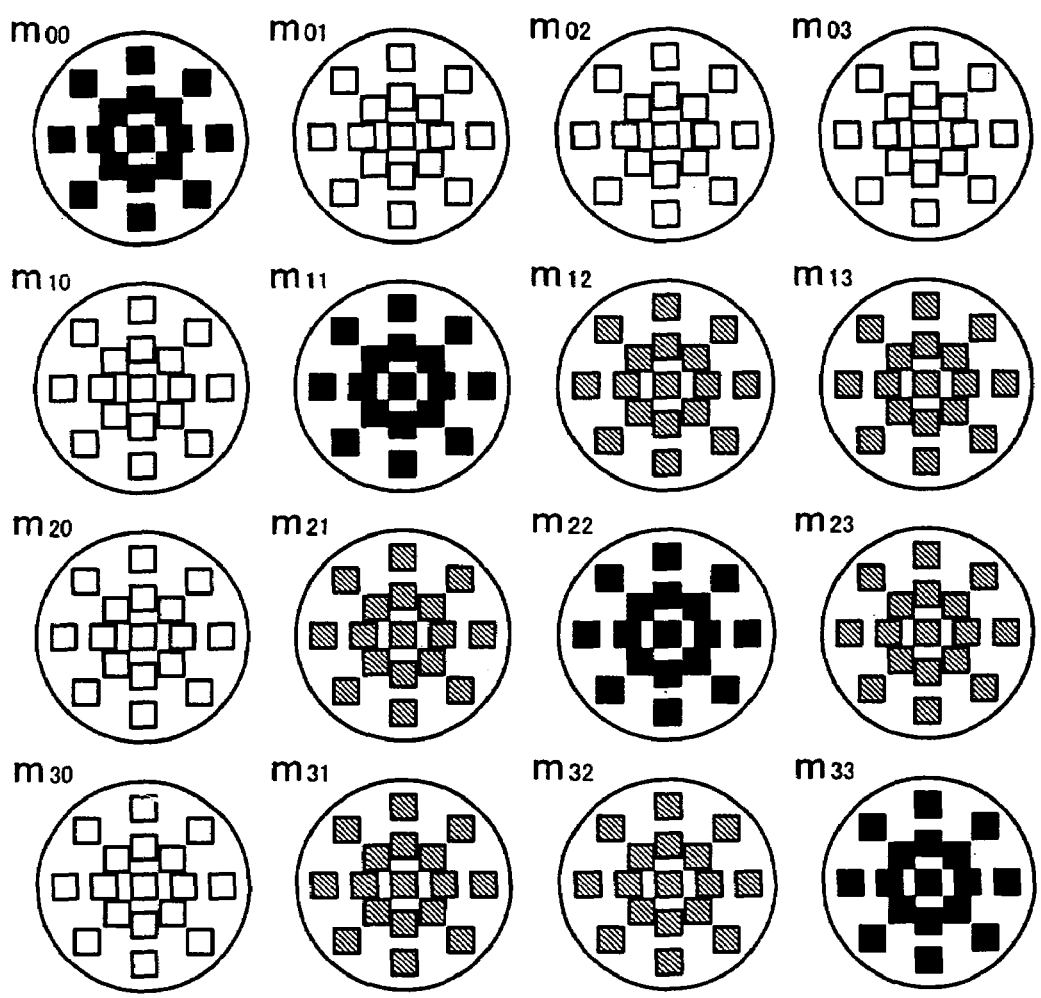
FIG. 6 shows an example of measurements of Mueller Matrix (M).

In addition, the equation [33] obtained from the equation [29] minus the equation [31] and the determined retardance $\Delta$ can be used as the basis to determine the $s_3'$. In view of such an incident angle dependence of the retardance of the quarter-wave plate, measurements can be expected as shown in FIG. 6. In FIG. 6, the circles show numerical apertures NA of the projection optical system 6.

$$s_3' \sin\Delta = I(P_{90} R_{\Delta 45} S') - I(P_{90} R_{\Delta -45} S')$$  [Equation 33]

THE THIRD EMBODIMENT

The third embodiment of the present invention will now be described with reference to FIG. 7.

The first and second embodiments measure Mueller matrix of the projection optical system 6 on the assumption that the photomask 5 has no polarization characteristics. The photomask, however, may have birefringence during a process such as polishing, or may generate stress birefringence when being fixed on the exposure apparatus. In this embodiment, therefore, the photomask 5 with such polarization characteristics is considered as the linear phase retarder and its Mueller Matrix ($R_{\Delta\theta}$) is calculated separately from the projection optical system 6.

Figure 7:
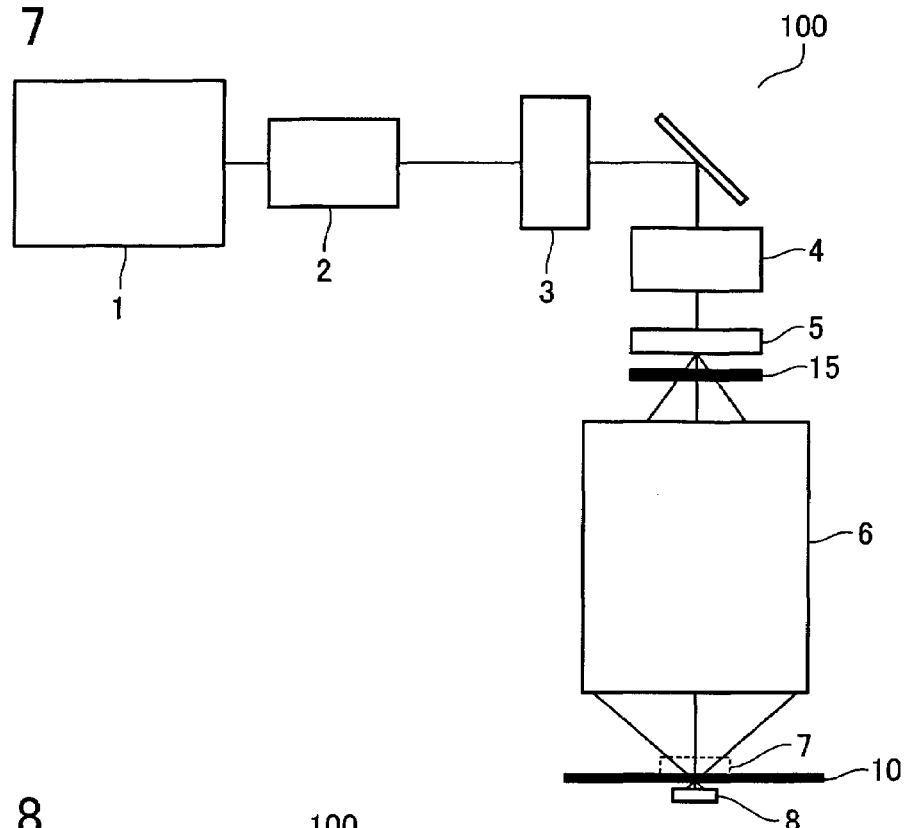
FIG. 7 shows a configuration of the exposure apparatus 100 according to the third embodiment of the present invention.

To calculate Mueller Matrix ($R_{\Delta\theta}$), this embodiment has the linear polarizer 15 disposed downstream of the photomask 5, more specifically between the photomask 5 and the projection optical system 6, as shown in FIG. 7. This linear polarizer 15 can be inserted at two azimuths, which are assumed here to be set at 0 degrees and 45 degrees. For each of 0 degrees and 45 degrees azimuths, the first polarization conversion system 2 can emit two types of polarized light beams (which are assumed here to be a clockwise circularly polarized light beam ($S^{(3)}$), and a counterclockwise circularly polarized light beam ($S^{(6)}$). These four combinations can allow the photodetector 8 to detect four light intensities. Mueller Matrix (R$\Delta\theta$) is calculated based on the detection results. The second polarization conversion system 7 is preferably removed from the optical path, but may be left inserted in the optical path.

The specific procedure for calculating Mueller Matrix (R$\Delta\theta$) of the photomask 5 will now be described.

First, the first polarization conversion system 2 emits the clockwise circularly polarized light beam ($S^{(3)}$), and the linear polarizer 15 is set at 0 degrees azimuth. If the Mueller matrix of the projection optical system 6 is expressed as (M) (which is assumed to mean Mueller matrix of the optical detection section 8 alone without the photomask 5 having the polarization characteristics involved), the converted polarized light beam ($MP_0 R_{\Delta\theta} S^{(3)}$) arriving at the optical detection section 8 can be expressed by the following equation [34] and the light intensity $I_{O,CW}$ detected by the optical detection section 8 can be expressed by the following equation [35].

$$MP_0R_{\Delta\theta}S^{(3)} = \begin{pmatrix} m_{00} & m_{01} & m_{02} & m_{03} \\ m_{10} & m_{11} & m_{12} & m_{13} \\ m_{20} & m_{21} & m_{22} & m_{23} \\ m_{30} & m_{31} & m_{32} & m_{33} \end{pmatrix} \frac{1}{2}\begin{pmatrix} 1 & 1 & 0 & 0 \\ 1 & 1 & 0 & 0 \\ 0 & 0 & 0 & 0 \\ 0 & 0 & 0 & 0 \end{pmatrix} \times$$

[Equation 34]

$$\begin{pmatrix} 1 & 0 & 0 & 0 \\ 0 & 1-(1-\cos\Delta)\sin^2 2\theta & (1-\cos\Delta)\sin 2\theta\cos 2\theta & -\sin\Delta\sin 2\theta \\ 0 & (1-\cos\Delta)\sin 2\theta\cos 2\theta & 1-(1-\cos\Delta)\cos^2 2\theta & \sin\Delta\cos 2\theta \\ 0 & \sin\Delta\sin 2\theta & -\sin\Delta\cos 2\theta & \cos\Delta \end{pmatrix}\begin{pmatrix} 1 \\ 0 \\ 0 \\ 1 \end{pmatrix}$$

$$= \begin{pmatrix} (m_{00}+m_{01}) - (m_{00}+m_{01})\sin\Delta\sin 2\theta \\ (m_{10}+m_{11}) - (m_{10}+m_{11})\sin\Delta\sin 2\theta \\ (m_{20}+m_{21}) - (m_{20}+m_{21})\sin\Delta\sin 2\theta \\ (m_{30}+m_{31}) - (m_{30}+m_{31})\sin\Delta\sin 2\theta \end{pmatrix}$$

$$I_{0,CW} = I(MP_0R_{\Delta\theta}S^{(3)}) = \frac{(m_{00}+m_{01}) - (m_{00}+m_{01})\sin\Delta\sin 2\theta}{2}$$

[Equation 35]

Likewise, for the first polarization conversion system 2 emitting the counterclockwise circularly polarized light beam ($S^{(6)}$), and the linear polarizer 15 being set at 0 degrees azimuth, the light intensity $I_{O,CCW}$ detected by the optical detection section 8 can be expressed by the following equation [36].

$$I_{0,CCW} = I(MP_0R_{\Delta\theta}S^{(6)})$$

[Equation 36]

$$= \frac{(m_{00}+m_{01}) + (m_{00}+m_{01})\sin\Delta\sin 2\theta}{2}$$

Likewise, for the first polarization conversion system 2 emitting the clockwise circularly polarized light beam ($S^{(3)}$), and the linear polarizer 15 being set at 45 degrees azimuth, the light intensity $I_{45,CW}$ detected by the optical detection section 8 can be expressed by the following equation [37].

$$I_{45,CW} = I(MP_{45}R_{\Delta\theta}S^{(3)}) = \frac{(m_{00}+m_{02}) + (m_{00}+m_{02})\sin\Delta\cos 2\theta}{2}$$

[Equation 37]

Likewise, for the first polarization conversion system 2 emitting the counterclockwise circularly polarized light beam ($S^{(6)}$), and the linear polarizer 15 being set at 45 degrees azimuth, the light intensity $I_{45,CCW}$ detected by the optical detection section 8 can be expressed by the following equation [38].

$$I_{45,CCW} = I(MP_{45}R_{\Delta\theta}S^{(6)}) = \frac{(m_{00}+m_{02}) - (m_{00}+m_{02})\sin\Delta\cos 2\theta}{2}$$

[Equation 38]

From these equations [35] to [38], the azimuth $\theta$ and retardance $\Delta$ for the photomask 5 that is considered as the linear phase retarder can be determined by the following equations [39] and [40], separately from Mueller Matrix(M) of the projection optical system 6 alone.

$$\theta = \frac{1}{2}\tan^{-1}\left(\frac{I_{0,CCW} - I_{0,CCW}}{I_{0,CCW} + I_{0,CCW}} \bigg/ \frac{I_{45,CW} - I_{45,CCW}}{I_{45,CW} - I_{45,CCW}}\right)$$

[Equation 39]

$$\Delta = \pm\sin^{-1}\sqrt{\left(\frac{I_{0,CCW} - I_{0,CCW}}{I_{0,CCW} - I_{0,CW}}\right)^2 + \left(\frac{I_{45,CW} - I_{45,CCW}}{I_{45,CW} + I_{45,CCW}}\right)^2}$$

[Equation 40]

A calculation cannot determine the sign (+, −) of the retardance $\Delta$ shown in the equation [40]. The sign of the stress birefringence generated during clamping photomask 5, however, can easily be estimated. The comparison with the estimated result can thus easily determine the sign of the retardance $\Delta$.

From the azimuth $\theta$ and retardance $\Delta$ thus obtained, Mueller Matrix ($R_{\Delta\theta}$) of the photomask 5 can be determined.

For the photomask 5 having the polarization characteristics, Mueller Matrix (which is expressed as (M')) measured in the manner shown in the first and second embodiments has a following relationship with the Mueller Matrix (M) of the actual projection optical system 6 alone.

$$M' = M \times R_{\Delta\theta}$$

[Equation 41]

Therefore, using the inverse matrix ($R\Delta\theta^{-1}$) of the ($R\Delta\theta$), the Mueller Matrix (M) of the actual projection optical system 6 alone can be determined as follows.

$$M = M' \times R_{\Delta\theta}^{-1} = M' \times R_{-\Delta\theta}$$

[Equation 42]

THE FOURTH EMBODIMENT

The fourth embodiment of the present invention will now be described with reference to FIG. 8. This embodiment is intended to measure Mueller matrix of the projection optical system 6 with high accuracy in the case of the photomask 5 as well as the illumination optical system 3 having the polarization characteristics.

This embodiment considers the combination of the illumination optical system 3 and photomask 5 as a single optical element, Mueller matrix of which is expressed as (R).

For the illumination optical system 3 that can be considered as the linear phase retarder as for the photomask 5 in the third embodiment, (R) can be expressed as follows.

$$R = \begin{pmatrix} 1 & 0 & 0 & 0 \\ 0 & r_{11} & r_{12} & r_{13} \\ 0 & r_{21} & r_{22} & r_{23} \\ 0 & r_{31} & r_{32} & r_{33} \end{pmatrix}$$ [Equation 43]

Any number of $R\Delta\theta$ which are multiplied together can be expressed in this form. Determination of the total Mueller Matrix (R) of the combination of the illumination optical system 3 and photomask 5 can determine Mueller Matrix (M) of the projection optical system 6 alone, as in the third embodiment.

As shown in FIG. 8, the photomask 5 and projection optical system 6 includes therebetween the third polarization conversion system 9 that includes the combination of the linear polarizer 15' and quarter-wave plate 16. This third polarization conversion system 9 has the same configuration as the second polarization conversion system 7. The second polarization conversion system 7 may thus be moved from the imaging surface 10 in between the photomask 5 and projection optical system 6 to be used as the third polarization conversion system. Of course, the second polarization conversion system 7 may remain and the third polarization conversion system can additionally be provided.

The linear polarizer 15' of the third polarization conversion system 9 can switched between two azimuths of 0 degrees and 90 degrees. The quarter-wave plate 16 can switch between a condition in which it is removed from the optical path (or it has the same azimuth as the linear polarizer 15') and a condition in which it is inserted into the optical path at −45 degrees azimuth.

This embodiment calculates the element $r_{11}$ of Mueller Matrix(R) with the linear polarizer 15' set at 0 degrees azimuth and the quarter-wave plate 16 removed from the optical path, and with the 0 degrees linearly polarized light beam ($S^{(1)}$) and 90 degrees linearly polarized light beam ($S^{(4)}$) emitted from the first polarization conversion system 2.

First, for the 0 degrees linearly polarized light beam ($S^{(1)}$) being projected, the converted polarized light beam reaching the photodetector 8 can be expressed as follows with Mueller Matrix (M) of the projection optical system 6 alone.

$$MP_0RS^{(1)} = \begin{pmatrix} m_{00} & m_{01} & m_{02} & m_{03} \\ m_{10} & m_{11} & m_{12} & m_{13} \\ m_{20} & m_{21} & m_{22} & m_{23} \\ m_{30} & m_{31} & m_{32} & m_{33} \end{pmatrix}$$ [Equation 44]

$$= \frac{1}{2}\begin{pmatrix} 1 & 1 & 0 & 0 \\ 1 & 1 & 0 & 0 \\ 0 & 0 & 0 & 0 \\ 0 & 0 & 0 & 0 \end{pmatrix}\begin{pmatrix} 1 & 0 & 0 & 0 \\ 0 & r_{11} & r_{12} & r_{13} \\ 0 & r_{21} & r_{22} & r_{23} \\ 0 & r_{31} & r_{32} & r_{33} \end{pmatrix}\begin{pmatrix} 1 \\ 1 \\ 0 \\ 0 \end{pmatrix} =$$

$$\frac{1}{2}\begin{pmatrix} (m_{00}+m_{01}) + (m_{00}+m_{01})r_{11} \\ (m_{10}+m_{11}) + (m_{10}+m_{11})r_{11} \\ (m_{20}+m_{21}) + (m_{20}+m_{21})r_{11} \\ (m_{30}+m_{31}) + (m_{30}+m_{31})r_{11} \end{pmatrix}$$

The light intensity of the converted polarized light beam detected by the photodetector 8 can be expressed as follows.

$$I(MP_0RS^{(1)}) = \frac{(m_{00}+m_{01}) + (m_{00}+m_{01})r_{11}}{2}$$ [Equation 45]

For the polarized light beam emitted from the first polarization conversion system 2 being only changed from the 0 degrees linearly polarized light beam ($S^{(1)}$) to 90 degrees linearly polarized light beam ($S^{(4)}$), the light intensity of the converted polarized light beam detected by the photodetector 8 can be expressed as follows.

$$I(MP_0RS^{(4)}) = \frac{(m_{00}+m_{01}) - (m_{00}+m_{01})r_{11}}{2}$$ [Equation 46]

From these equations [45], [46], the $r_{11}$ can be calculated by the following equation [47].

$$\frac{I(MP_0RS^{(1)}) - I(MP_0RS^{(4)})}{I(MP_0RS^{(1)}) + I(MP_0RS^{(4)})} = r_{11}$$ [Equation 47]

The $r_{12}$ can also be calculated by the following equation [48], with the linear polarizer 15' set at 0 degrees azimuth and the quarter-wave plate 16 removed from the optical path, and with the 45 degrees linearly polarized light beam ($S^{(2)}$) and −45 degrees linearly polarized light beam ($S^{(5)}$) emitted serially from the first polarization conversion system 2.

$$\frac{I(MP_0RS^{(2)}) - I(MP_0RS^{(5)})}{I(MP_0RS^{(2)}) + I(MP_0RS^{(5)})} = r_2$$ [Equation 48]

The $r_{13}$ can also be calculated by the following equation [49], with the linear polarizer 15' set at 0 degrees azimuth and the quarter-wave plate 16 removed from the optical path, and with the clockwise circularly polarized light beam ($S^{(3)}$) and counterclockwise circularly polarized light beam ($S^{(6)}$) emitted serially from the first polarization conversion system 2.

$$\frac{I(MP_0RS^{(3)}) - I(MP_0RS^{(6)})}{I(MP_0RS^{(3)}) + I(MP_0RS^{(6)})} = r_{13}$$ [Equation 49]

The $r_{21}$ can also be calculated by the following equation [50], with the linear polarizer 15' set at 45 degrees azimuth and the quarter-wave plate 16 removed from the optical path, and with the 0 degrees linearly polarized light beam ($S^{(1)}$) and 90 degrees linearly polarized light beam ($S^{(4)}$) emitted serially from the first polarization conversion system 2.

$$\frac{I(MP_{45}RS^{(1)}) - I(MP_{45}RS^{(4)})}{I(MP_{45}RS^{(1)}) + I(MP_{45}RS^{(4)})} = r_{21}$$ [Equation 50]

The $r_{22}$ can also be calculated by the following equation [51], with the linear polarizer 15' set at 45 degrees azimuth and the quarter-wave plate 16 removed from the optical path, and with the 45 degrees linearly polarized light beam ($S^{(2)}$) and −45 degrees linearly polarized light beam ($S^{(5)}$) emitted serially from the first polarization conversion system 2.

$$\frac{I(MP_{45}RS^{(2)}) + I(MP_{45}RS^{(5)})}{I(MP_{45}RS^{(2)}) - I(MP_{45}RS^{(5)})} = r_{22} \quad \text{[Equation 51]}$$

The $r_{23}$ can also be calculated by the following equation [52], with the linear polarizer 15' set at 45 degrees azimuth and the quarter-wave plate 16 removed from the optical path, and with the clockwise circularly polarized light beam ($S^{(3)}$) and counterclockwise circularly polarized light beam ($S^{(6)}$) emitted serially from the first polarization conversion system 2.

$$\frac{I(MP_{45}RS^{(3)}) + I(MP_{45}RS^{(6)})}{I(MP_{45}RS^{(3)}) - I(MP_{45}RS^{(6)})} = r_{23} \quad \text{[Equation 52]}$$

The $r_{31}$, $r_{32}$, and $r_{33}$ can be calculated with the quarter-wave plate 16 inserted into the optical path at −45 degrees azimuth.

First, $r_{31}$ can be calculated with the linear polarizer 15' set at 0 degrees azimuth and the quarter-wave plate 16 inserted into the optical path at −45 degrees azimuth, and with the 0 degrees linearly polarized light beam ($S^{(1)}$) and 90 degrees linearly polarized light beam ($S^{(6)}$) emitted serially from the first polarization conversion system 2.

For the 0 degrees linearly polarized light beam ($S^{(1)}$) emitted, the converted polarized light beam reaching the photodetector 8 can be expressed as follows.

$$MP_0Q_{-45}RS^{(1)} = \begin{pmatrix} m_{00} & m_{01} & m_{02} & m_{03} \\ m_{10} & m_{11} & m_{12} & m_{13} \\ m_{20} & m_{21} & m_{22} & m_{23} \\ m_{30} & m_{31} & m_{32} & m_{33} \end{pmatrix} \frac{1}{2}\begin{pmatrix} 1 & 1 & 0 & 0 \\ 1 & 1 & 0 & 0 \\ 0 & 0 & 0 & 0 \\ 0 & 0 & 0 & 0 \end{pmatrix}\begin{pmatrix} 1 & 0 & 0 & 0 \\ 0 & 0 & 0 & 1 \\ 0 & 0 & 1 & 0 \\ 0 & -1 & 0 & 0 \end{pmatrix}$$

$$= \begin{pmatrix} 1 & 0 & 0 & 0 \\ 0 & r_{11} & r_{12} & r_{13} \\ 0 & r_{21} & r_{22} & r_{23} \\ 0 & r_{31} & r_{32} & r_{33} \end{pmatrix}\begin{pmatrix} 1 \\ 1 \\ 0 \\ 0 \end{pmatrix}$$

$$= \frac{1}{2}\begin{pmatrix} (m_{00} + m_{01}) + (m_{00} + m_{01})r_{31} \\ (m_{10} + m_{11}) + (m_{10} + m_{11})r_{31} \\ (m_{20} + m_{21}) + (m_{20} + m_{21})r_{31} \\ (m_{30} + m_{31}) + (m_{30} + m_{31})r_{31} \end{pmatrix}$$

[Equation 53]

The light intensity of the converted polarized light beams detected by the photodetector 8 can be expressed as follows.

$$I(MP_0Q_{-45}RS^{(1)}) = \frac{(m_{00} + m_{01}) + (m_{00} + m_{01})r_{31}}{2} \quad \text{[Equation 54]}$$

For the polarized light beam emitted from the first polarization conversion system 2 being changed to the 90 degrees linearly polarized light beam ($S^{(4)}$), the light intensity of the converted polarized light beam detected by the photodetector 8 can be expressed as follows.

$$I(MP_0Q_{-45}RS^{(4)}) = \frac{(m_{00} + m_{01}) - (m_{00} + m_{01})r_{31}}{2} \quad \text{[Equation 55]}$$

From these equations (54), (55), the $r_{31}$ can be calculated by the following equation [56].

$$\frac{I(MP_0Q_{-45}RS^{(1)}) - I(MP_0Q_{-45}RS^{(4)})}{I(MP_0Q_{-45}RS^{(1)}) + I(MP_0Q_{-45}RS^{(4)})} = r_{31} \quad \text{[Equation 56]}$$

The $r_{32}$ can also be calculated by the following equation [57], with the linear polarizer 15' set at 0 degrees azimuth and the quarter-wave plate 16 inserted into the optical path at −45 degrees azimuth, and with the 45 degrees linearly polarized light beam ($S^{(2)}$) and −45 degrees linearly polarized light beam ($S^{(5)}$) emitted from the first polarization conversion system 2.

$$\frac{I(MP_0Q_{-45}RS^{(2)}) - I(MP_0Q_{-45}RS^{(5)})}{I(MP_0Q_{-45}RS^{(2)}) + I(MP_0Q_{-45}RS^{(5)})} = r_{32} \quad \text{[Equation 57]}$$

The $r_{33}$ can also be calculated by the following equation [58], with the linear polarizer 15' set at 0 degrees azimuth and the quarter-wave plate 16 inserted into the optical path at −45 degrees azimuth, and with the clockwise circularly polarized light beam ($S^{(3)}$) and counterclockwise circularly polarized light beam ($S^{(6)}$) emitted from the first polarization conversion system 2.

$$\frac{I(MP_0Q_{-45}RS^{(3)}) - I(MP_0Q_{-45}RS^{(6)})}{I(MP_0Q_{-45}RS^{(3)}) + I(MP_0Q_{-45}RS^{(6)})} = r_{33} \quad \text{[Equation 58]}$$

In this manner, Mueller Matrix (R) can be determined for the illumination optical system 3 and photomask 5 that are considered as a single optical system. The correction with the inverse matrix of the (R) can then determine Mueller Matrix (M) of the projection optical system 6 alone by the following equation [59].

Various changes can apply to the third polarization conversion system 9 as for the above-described second polarization conversion system 7. For example, the quarter-wave plate 16 can generally be replaced with the linear phase retarder which can provide the phase difference Δ. Instead of the linear polarizer 15' being switched between different azimuths and the quarter-wave plate 16 being switched between being inserted into and removed from the optical path or between different azimuths, the azimuth of the linear polarizer 15' may be fixed at, for example, 0 degrees and the azimuth of the quarter-wave plate 16 may be changed to measure the light intensity.

$$M = M' \times R^{-1} \qquad \text{[Equation 59]}$$

THE FIFTH EMBODIMENT

The fifth embodiment of the present invention will now be described. This embodiment describes the case where an ideal single optical element including the illumination optical system 3 and photomask 5 is any polarization element, more specifically, where Mueller Matrix (R) is expressed as follows.

$$R = \begin{pmatrix} 1 & r_{01} & r_{02} & r_{03} \\ r_{10} & r_{11} & r_{12} & r_{13} \\ r_{20} & r_{21} & r_{22} & r_{23} \\ r_{30} & r_{31} & r_{32} & r_{33} \end{pmatrix} \qquad \text{[Equation 60]}$$

For example, the illumination optical system 3 is assumed to contain an optical element such as the depolarizing plate. In the equation [60], the upper left element $r_{00}$ of the matrix (R) is 1 (one). It is because the $r_{00}$ corresponds to emitted light intensity for non-polarized light beam incident on the optical system, i.e., to the transmittance of the system, and all the other elements can be expressed as the $R_{00}$ times a coefficient.

This embodiment calculates the elements of Mueller Matrix (R) shown in the equation [60] by arranging the exposure apparatus configured as shown in FIG. 8 to have the linear polarizer 15' switching between two azimuths (such as 0° and 90°, or 45 degrees and −45 degrees), and for each azimuth, the first polarization conversion system 2 emitting two types of polarized light beams that are symmetric about the origin on Poincare sphere PB (such as ($S^{(1)}$) and ($S^{(4)}$), ($S^{(2)}$) and ($S^{(5)}$), or ($S^{(3)}$) and ($S^{(6)}$)) into the illumination optical system 3.

First, a description is given of how the elements $r_{11}$, $r_{12}$, and $r_{13}$ of (R) can be calculated. With the linear polarizer 15' set at 0° or 90° azimuth, the first polarization conversion system 2 emits serially the polarized light beams ($S^{(1)}$) and ($S^{(4)}$) for each azimuth.

First, the combination of the linear polarizer 15' with 0 degrees azimuth and the polarized light beam ($S^{(1)}$) with 0 degrees azimuth (0 degrees linearly polarized light beam) can provide the following equation [61].

$$I(MP_0 RS^{(1)}) = \qquad \text{[Equation 61]}$$
$$\frac{1}{2}\{(m_{00} + m_{01})(1 + r_{01}) + (m_{00} + m_{01})(r_{10} + r_{11})\}$$

The combination of the linear polarizer 15' with 0 degrees azimuth and the polarized light beam ($S^{(4)}$) with 90 degrees azimuth (90 degrees linearly polarized light beam) can then provide the following equation [62].

$$I(MP_0 RS^{(4)}) = \qquad \text{[Equation 62]}$$
$$\frac{1}{2}\{(m_{00} + m_{01})(1 - r_{01}) + (m_{00} + m_{01})(r_{10} - r_{11})\}$$

The ratio of sum and difference between these equations [61] and [62] can be expressed as follows.

$$\frac{I(MP_0 RS^{(1)}) - I(MP_0 RS^{(4)})}{I(MP_0 RS^{(1)}) + I(MP_0 RS^{(4)})} = \frac{r_{01} + r_{11}}{1 + r_{10}} \qquad \text{[Equation 63]}$$

This ratio is defined as follows.

$$\frac{r_{01} + r_{11}}{1 + r_{10}} = J_{(0)S1} \qquad \text{[Equation 64]}$$

Likewise, the linear polarizer 15' set at 90 degrees azimuth and the polarized light beams ($S^{(1)}$), ($S^{(4)}$) projected can provide the following equation [65].

$$\frac{I(MP_{90} RS^{(1)}) - I(MP_{90} RS^{(4)})}{I(MP_{90} RS^{(1)}) + I(MP_{90} RS^{(4)})} = \frac{r_{01} - r_{11}}{1 - r_{10}} = J_{(90)S1} \qquad \text{[Equation 65]}$$

For other illumination conditions, the following equations [66] to [69] can likewise be obtained.

$$\frac{I(MP_0 RS^{(2)}) - I(MP_0 RS^{(5)})}{I(MP_0 RS^{(2)}) + I(MP_0 RS^{(5)})} = \frac{r_{02} + r_{12}}{1 + r_{10}} = J_{(0)S2} \qquad \text{[Equation 66]}$$

$$\frac{I(MP_{90} RS^{(2)}) - I(MP_{90} RS^{(5)})}{I(MP_{90} RS^{(2)}) + I(MP_{90} RS^{(5)})} = \frac{r_{02} - r_{12}}{1 - r_{10}} = J_{(90)S2} \qquad \text{[Equation 67]}$$

$$\frac{I(MP_0 RS^{(3)}) - I(MP_0 RS^{(6)})}{I(MP_0 RS^{(3)}) + I(MP_0 RS^{(6)})} = \frac{r_{03} + r_{13}}{1 + r_{10}} = J_{(0)S3} \qquad \text{[Equation 68]}$$

$$\frac{I(MP_{90} RS^{(3)}) - I(MP_{90} RS^{(6)})}{I(MP_{90} RS^{(3)}) + I(MP_{90} RS^{(6)})} = \frac{r_{03} - r_{13}}{1 - r_{10}} = J_{(90)S3} \qquad \text{[Equation 69]}$$

Therefore, if the $r_{10}$ is determined, the above equations [66] to [69] can be used to calculate the $r_{11}$, $r_{12}$, and $r_{13}$, by the following equations [70] to [72].

$$r_{11} = \frac{1}{2}\{(J_{(0)S1} - J_{(90)S1}) + (J_{(0)S1} + J_{(90)S1})r_{10}\} \qquad \text{[Equation 70]}$$

$$r_{12} = \frac{1}{2}\{(J_{(0)S2} - J_{(90)S2}) + (J_{(0)S2} + J_{(90)S2})r_{10}\} \qquad \text{[Equation 71]}$$

$$r_{13} = \frac{1}{2}\{(J_{(0)S3} - J_{(90)S3}) + (J_{(0)S3} + J_{(90)S3})r_{10}\} \qquad \text{[Equation 72]}$$

The $r_{21}$, $r_{22}$, and $r_{23}$ can be obtained with the linear polarizer 15' set at 45 degrees and −45 degrees azimuths, and two types of polarized light beams symmetric about the origin on Poincare sphere PB emitted for each azimuth. This can provide the following equations [73] to [78], in which if the $r_{20}$ is determined, the $r_{21}$, $r_{22}$, and $r_{23}$ can be obtained by the following equations [79] to [81].

$$\frac{I(MP_{45}RS^{(1)}) - I(MP_{45}RS^{(4)})}{I(MP_{45}RS^{(1)}) + I(MP_{45}RS^{(4)})} = \frac{r_{01} + r_{21}}{1 + r_{20}} = J_{(45)S1}$$ [Equation 73]

$$\frac{I(MP_{-45}RS^{(1)}) - I(MP_{-45}RS^{(4)})}{I(MP_{-45}RS^{(1)}) + I(MP_{-45}RS^{(4)})} = \frac{r_{01} + r_{21}}{1 + r_{20}} = J_{(-45)S1}$$ [Equation 74]

$$\frac{I(MP_{45}RS^{(2)}) - I(MP_{45}RS^{(5)})}{I(MP_{45}RS^{(2)}) + I(MP_{45}RS^{(5)})} = \frac{r_{02} + r_{22}}{1 + r_{20}} = J_{(45)S2}$$ [Equation 75]

$$\frac{I(MP_{-45}RS^{(2)}) - I(MP_{-45}RS^{(5)})}{I(MP_{-45}RS^{(2)}) + I(MP_{-45}RS^{(5)})} = \frac{r_{02} - r_{22}}{1 - r_{20}} = J_{(-45)S2}$$ [Equation 76]

$$\frac{I(MP_{45}RS^{(3)}) - I(MP_{45}RS^{(6)})}{I(MP_{45}RS^{(3)}) + I(MP_{45}RS^{(6)})} = \frac{r_{03} + r_{23}}{1 + r_{20}} = J_{(45)S3}$$ [Equation 77]

$$\frac{I(MP_{-45}RS^{(3)}) - I(MP_{-45}RS^{(6)})}{I(MP_{-45}RS^{(3)}) + I(MP_{-45}RS^{(6)})} = \frac{r_{03} - r_{23}}{1 - r_{20}} = J_{(-45)S3}$$ [Equation 78]

$$r_{21} = \frac{1}{2}\{(J_{(45)S1} - J_{(-45)S1}) + (J_{(45)S1} + J_{(-45)S1})r_{20}\}$$ [Equation 79]

$$r_{22} = \frac{1}{2}\{(J_{(45)S2} - J_{(-45)S2}) + (J_{(45)S2} + J_{(-45)S2})r_{20}\}$$ [Equation 80]

$$r_{23} = \frac{1}{2}\{(J_{(45)S3} - J_{(-45)S3}) + (J_{(45)S3} + J_{(-45)S3})r_{20}\}$$ [Equation 81]

The $r_{31}$, $r_{32}$, and $r_{33}$ can be obtained with the quarter-wave plate 16 inserted into the optical path at −45 degrees azimuth, with the linear polarizer 15' set at 0 degrees and 90 degrees azimuths, and with two types of polarized light beams symmetric about the origin on Poincare sphere PB emitted for each azimuth of the linear polarizer 15'. This can provide the following equations [82] to [87], in which if the $r_{20}$ is determined, the $r_{21}$, $r_{22}$, and $r_{23}$ can be obtained by the following equations [88] to [90].

$$\frac{I(MP_0Q_{-45}RS^{(1)}) - I(MP_0Q_{-45}RS^{(4)})}{I(MP_0Q_{-45}RS^{(1)}) + I(MP_0Q_{-45}RS^{(4)})} =$$ [Equation 82]
$$\frac{r_{01} + r_{31}}{1 + r_{30}} = J_{(0,-45)S1}$$

$$\frac{I(MP_{90}Q_{-45}RS^{(1)}) - I(MP_{90}Q_{-45}RS^{(4)})}{I(MP_{90}Q_{-45}RS^{(1)}) + I(MP_{90}Q_{-45}RS^{(4)})} =$$ [Equation 83]
$$\frac{r_{01} - r_{31}}{1 - r_{30}} = J_{(90,-45)S1}$$

$$\frac{I(MP_0Q_{-45}RS^{(2)}) - I(MP_0Q_{-45}RS^{(5)})}{I(MP_0Q_{-45}RS^{(2)}) + I(MP_0Q_{-45}RS^{(5)})} =$$ [Equation 84]
$$\frac{r_{02} + r_{32}}{1 + r_{30}} = J_{(0,-45)S2}$$

$$\frac{I(MP_{90}Q_{-45}RS^{(2)}) - I(MP_{90}Q_{-45}RS^{(5)})}{I(MP_{90}Q_{-45}RS^{(2)}) + I(MP_{90}Q_{-45}RS^{(5)})} =$$ [Equation 85]
$$\frac{r_{02} - r_{32}}{1 - r_{30}} = J_{(90,-45)S2}$$

$$\frac{I(MP_0Q_{-45}RS^{(3)}) - I(MP_0Q_{-45}RS^{(6)})}{I(MP_0Q_{-45}RS^{(3)}) + I(MP_0Q_{-45}RS^{(6)})} =$$ [Equation 86]
$$\frac{r_{03} + r_{33}}{1 + r_{30}} = J_{(0,-45)S3}$$

$$\frac{I(MP_{90}Q_{-45}RS^{(3)}) - I(MP_{90}Q_{-45}RS^{(6)})}{I(MP_{90}Q_{-45}RS^{(3)}) + I(MP_{90}Q_{-45}RS^{(6)})} =$$ [Equation 87]
$$\frac{r_{03} - r_{33}}{1 - r_{30}} = J_{(90,-45)S3}$$

-continued $$r_{31} =$$ [Equation 88]
$$\frac{1}{2}\{(J_{(0,-45)S1} - J_{(90,-45)S1}) + (J_{(0,-45)S1} + J_{(90,-45)S1})r_{30}\}$$

$$r_{32} =$$ [Equation 89]
$$\frac{1}{2}\{(J_{(0,-45)S2} - J_{(90,-45)S2}) + (J_{(0,-45)S2} + J_{(90,-45)S2})r_{30}\}$$

$$r_{33} =$$ [Equation 90]
$$\frac{1}{2}\{(J_{(0,-45)S3} - J_{(90,-45)S3}) + (J_{(0,-45)S3} + J_{(90,-45)S3})r_{30}\}$$

The $r_{01}$, $r_{02}$, and $r_{03}$ can commonly be calculated by the following equations [91] to [93].

$$r_{01} = \frac{1}{2}\{(J_{(0)S1} + J_{(90)S1}) + (J_{(0)S1} - J_{(90)S1})r_{10}\}$$ [Equation 91]
$$= \frac{1}{2}\{(J_{(45)S1} + J_{(-45)S1}) + (J_{(45)S1} - J_{(-45)S1})r_{20}\}$$
$$= \frac{1}{2}\{(J_{(0,-45)S1} + J_{(90,-45)S1}) + (J_{(0,-45)S1} - J_{(90,-45)S1})r_{30}\}$$

$$r_{02} = \frac{1}{2}\{(J_{(0)S2} + J_{(90)S2}) + (J_{(0)S2} - J_{(90)S2})r_{10}\}$$ [Equation 92]
$$= \frac{1}{2}\{(J_{(45)S2} + J_{(-45)S2}) + (J_{(45)S2} - J_{(-45)S2})r_{20}\}$$
$$= \frac{1}{2}\{(J_{(0,-45)S2} + J_{(90,-45)S2}) + (J_{(0,-45)S2} - J_{(90,-45)S2})r_{30}\}$$

$$r_{03} = \frac{1}{2}\{(J_{(0)S3} + J_{(90)S3}) + (J_{(0)S3} - J_{(90)S3})r_{10}\}$$ [Equation 93]
$$= \frac{1}{2}\{(J_{(45)S3} + J_{(-45)S3}) + (J_{(45)S3} - J_{(-45)S3})r_{20}\}$$
$$= \frac{1}{2}\{(J_{(0,-45)S3} + J_{(90,-45)S3}) + (J_{(0,-45)S3} - J_{(90,-45)S3})r_{30}\}$$

As described above, if the $r_{10}$, $r_{20}$, and $r_{30}$ are determined, Mueller Matrix (R) of the entire optical system including the illumination optical system 3 and photomask 5 can be identified independently of Mueller Matrix (M) of the projection optical system 6. From the above equations, these $r_{10}$, $r_{20}$, and $r_{30}$ can be expressed by the following equations [94] to [96].

$$r_{10} = \frac{\beta_{22}(\alpha_{11} - \alpha_{21}) - \beta_{21}(\alpha_{12} - \alpha_{22})}{\beta_{12}\beta_{21} - \beta_{11}\beta_{22}}$$ [Equation 94]
$$= \frac{\beta_{23}(\alpha_{12} - \alpha_{22}) - \beta_{22}(\alpha_{13} - \alpha_{23})}{\beta_{13}\beta_{22} - \beta_{12}\beta_{23}}$$
$$= \frac{\beta_{21}(\alpha_{13} - \alpha_{23}) - \beta_{23}(\alpha_{11} - \alpha_{21})}{\beta_{11}\beta_{23} - \beta_{13}\beta_{21}}$$
$$= \frac{\beta_{32}(\alpha_{11} - \alpha_{31}) - \beta_{31}(\alpha_{12} - \alpha_{32})}{\beta_{12}\beta_{31} - \beta_{11}\beta_{32}}$$
$$= \frac{\beta_{33}(\alpha_{12} - \alpha_{32}) - \beta_{32}(\alpha_{13} - \alpha_{33})}{\beta_{13}\beta_{32} - \beta_{12}\beta_{33}}$$
$$= \frac{\beta_{31}(\alpha_{13} - \alpha_{33}) - \beta_{33}(\alpha_{11} - \alpha_{31})}{\beta_{11}\beta_{33} - \beta_{13}\beta_{31}}$$

-continued $$r_{20} = \frac{\beta_{12}(\alpha_{11}-\alpha_{21})-\beta_{11}(\alpha_{12}-\alpha_{22})}{\beta_{12}\beta_{21}-\beta_{11}\beta_{22}}$$
$$= \frac{\beta_{13}(\alpha_{12}-\alpha_{22})-\beta_{12}(\alpha_{13}-\alpha_{23})}{\beta_{13}\beta_{22}-\beta_{12}\beta_{23}}$$
$$= \frac{\beta_{11}(\alpha_{13}-\alpha_{23})-\beta_{13}(\alpha_{11}-\alpha_{21})}{\beta_{11}\beta_{23}-\beta_{13}\beta_{21}}$$
$$= \frac{\beta_{32}(\alpha_{21}-\alpha_{31})-\beta_{31}(\alpha_{22}-\alpha_{32})}{\beta_{22}\beta_{31}-\beta_{21}\beta_{32}}$$
$$= \frac{\beta_{33}(\alpha_{22}-\alpha_{32})-\beta_{32}(\alpha_{23}-\alpha_{33})}{\beta_{23}\beta_{32}-\beta_{22}\beta_{33}}$$
$$= \frac{\beta_{31}(\alpha_{23}-\alpha_{33})-\beta_{33}(\alpha_{21}-\alpha_{31})}{\beta_{21}\beta_{33}-\beta_{23}\beta_{31}}$$

[Equation 95]

$$r_{30} = \frac{\beta_{12}(\alpha_{11}-\alpha_{31})-\beta_{11}(\alpha_{12}-\alpha_{32})}{\beta_{12}\beta_{31}-\beta_{11}\beta_{32}}$$
$$= \frac{\beta_{13}(\alpha_{12}-\alpha_{32})-\beta_{12}(\alpha_{13}-\alpha_{33})}{\beta_{13}\beta_{32}-\beta_{12}\beta_{33}}$$
$$= \frac{\beta_{11}(\alpha_{13}-\alpha_{33})-\beta_{13}(\alpha_{11}-\alpha_{31})}{\beta_{11}\beta_{33}-\beta_{13}\beta_{31}}$$
$$= \frac{\beta_{22}(\alpha_{21}-\alpha_{31})-\beta_{21}(\alpha_{22}-\alpha_{32})}{\beta_{22}\beta_{31}-\beta_{21}\beta_{32}}$$
$$= \frac{\beta_{23}(\alpha_{22}-\alpha_{32})-\beta_{22}(\alpha_{23}-\alpha_{33})}{\beta_{23}\beta_{32}-\beta_{22}\beta_{33}}$$
$$= \frac{\beta_{21}(\alpha_{23}-\alpha_{33})-\beta_{23}(\alpha_{21}-\alpha_{31})}{\beta_{21}\beta_{33}-\beta_{23}\beta_{31}}$$

[Equation 96]

Each coefficient is defined by the following equation [97].

$$J_{(0)S1} + J_{(90)S1} = \alpha_{11},\ J_{(45)S1} + J_{(-45)S1} = \alpha_{21},$$
$$J_{(0,-45)S1} + J_{(90,-45)S1} = \alpha_{31},\ J_{(0)S1} - J_{(90)S1} = \beta_{11},$$
$$J_{(45)S1} - J_{(-45)S1} = \beta_{21},$$
$$J_{(0,-45)S1} - J_{(90,-45)S1} = \beta_{31},$$
$$J_{(0)S2} + J_{(90)S2} = \alpha_{12},\ J_{(45)S2} + J_{(-45)S2} = \alpha_{22},$$
$$J_{(0,-45)S2} + J_{(90,-45)S2} = \alpha_{32},\ J_{(0)S2} - J_{(90)S2} = \beta_{12},$$
$$J_{(45)S2} - J_{(-45)S2} = \beta_{22},$$
$$J_{(0,-45)S2} - J_{(90,-45)S2} = \beta_{32},$$
$$J_{(0)S3} + J_{(90)S3} = \alpha_{13},\ J_{(45)S3} + J_{(-45)S3} = \alpha_{23},$$
$$J_{(0,-45)S3} + J_{(90,-45)S3} = \alpha_{33},\ J_{(0)S3} - J_{(90)S3} = \beta_{13},$$
$$J_{(45)S3} - J_{(-45)S3} = \beta_{23},\ J_{(0,-45)S3} - J_{(90,-45)S3} = \beta_{33}$$

[Equation 97]

In this manner, if Mueller Matrix(R) is determined of the optical system including the illumination optical system 3 and photomask 5, the inverse matrix $(R^{-1})$ can be used to correct, as shown below, the Mueller Matrix (M') of the entire optical system from the illumination optical system 3 to the projection optical system 6, which the Mueller Matrix (M') is measured in the manner shown in the first embodiment.

$$M = M' \times R^{-1}$$

[Equation 98]

Thus, although the present invention has been described with reference to particular embodiments thereof, it is not limited to those embodiments, and various changes, additions or the like can be made without departing from the spirit of the present invention. For example, while the above-described embodiments use a total of six types of polarized incident light that include three types of polarized light beams $(S^{(1)})$ to $(S^{(3)})$ perpendicular to each other on Poincare sphere PB, and the polarized light beams $(S^{(4)})$ to $(S^{(6)})$ symmetric about the origin on Poincare sphere PB with the polarized light beams $(S^{(1)})$ to $(S^{(3)})$, the present invention is not limited thereto. For example, other than the three types of polarized light beams $(S^{(1)})$ to $(S^{(3)})$ perpendicular to each other, any one of the polarized light beams $(S^{(4)})$ to $(S^{(6)})$ may only be incident, i.e., four types of polarized light beams may only be incident on the optical system to be measured.

Six types of projected light $(S^{(1)})$ to $(S^{(6)})$ passing through the optical system with Mueller Matrix (M) are converted into converted polarized light beams $(S^{(1)'})$ to $(S^{(6)'})$, which can be expressed as follows.

$$S^{(1)'} = \begin{pmatrix} m_{00}+m_{01} \\ m_{10}+m_{11} \\ m_{20}+m_{21} \\ m_{30}+m_{31} \end{pmatrix},\ S^{(2)'} = \begin{pmatrix} m_{00}+m_{02} \\ m_{10}+m_{12} \\ m_{20}+m_{22} \\ m_{30}+m_{32} \end{pmatrix},$$

$$S^{(3)'} = \begin{pmatrix} m_{00}+m_{03} \\ m_{10}+m_{13} \\ m_{20}+m_{23} \\ m_{30}+m_{33} \end{pmatrix},\ S^{(4)'} = \begin{pmatrix} m_{00}+m_{01} \\ m_{10}+m_{11} \\ m_{20}+m_{21} \\ m_{30}+m_{31} \end{pmatrix},$$

$$S^{(5)'} = \begin{pmatrix} m_{00}+m_{02} \\ m_{10}+m_{12} \\ m_{20}+m_{22} \\ m_{30}+m_{32} \end{pmatrix},\ S^{(3)'} = \begin{pmatrix} m_{00}+m_{03} \\ m_{10}+m_{13} \\ m_{20}+m_{23} \\ m_{30}+m_{33} \end{pmatrix}.$$

[Equation 99]

For example, the $(S^{(1)'})$ and $(S^{(4)'})$ can provide the first and second columns of Mueller Matrix (M) as follows.

$$\frac{S^{(1)'}+S^{(4)'}}{2} = \begin{pmatrix} m_{00} \\ m_{10} \\ m_{20} \\ m_{30} \end{pmatrix},\ \frac{S^{(1)'}-S^{(4)'}}{2} = \begin{pmatrix} m_{01} \\ m_{11} \\ m_{21} \\ m_{31} \end{pmatrix},$$

[Equation 100]

In this manner, if two rows out of the four rows of Mueller Matrix (M) are determined, the other two rows can be obtained from the other two types of converted polarized light beams $(S^{(2)})$ and $(S^{(3)})$, or $(S^{(5)})$ and $(S^{(6)})$.

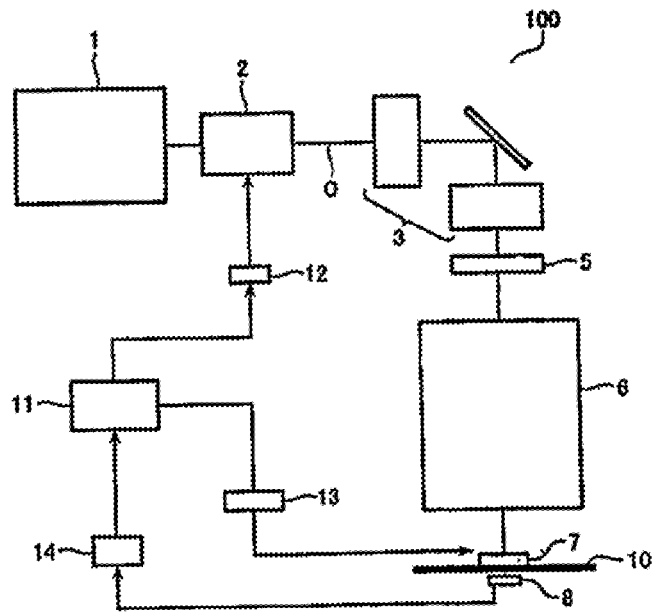

The invention claimed is:

1. An exposure apparatus including:
   a light source generating light flux;
   an illumination optical system introducing said light flux to a photomask; and
   a projection optical system projecting an image of a mask pattern onto an object to be exposed;
   said exposure apparatus further comprising:
   a first polarization conversion system serially converting said light flux into any of a plurality of polarized light beams perpendicular to each other on Poincare sphere and outputting said polarized light beam;
   a light intensity detection section disposed near an imaging position at which said projection optical system forms the image of said mask pattern to detect a light intensity of a converted polarized light beam obtained from said polarized light beam passing through said illumination optical system, said photomask, and said projection optical system;

a second polarization conversion system including a linear polarizer and a linear phase retarder, which is inserted in an optical path of said converted polarized light beam;

a parameter calculation section switching said linear polarizer between azimuths and switching said linear phase retarder between being inserted into and removed from the optical path or between azimuths, to obtain a plurality of data on said light intensity detected by said light intensity detection section and calculate Stokes parameters of said converted polarized light beam based on the plurality of data on the light intensity obtained; and a Mueller Matrix calculation section for calculating Mueller matrix of an optical system existing before the position at which said second polarization conversion system is inserted, based on the calculated Stokes parameters of said converted polarized light beam and the Stokes parameters of said polarized light beam output from said first polarization conversion system.

2. An exposure apparatus according to claim 1, wherein said linear polarizer can be set at an azimuth of 45×n degrees (n is integer).

3. An exposure apparatus according to claim 1, wherein said parameter calculation section removes said linear phase retarder from the optical path or sets said linear phase retarder at a same azimuth as said linear polarizer, sets said linear polarizer at an azimuth of 0 degrees, 90 degrees, 45 degrees, and −45 degrees, and obtains for each azimuth the light intensity data detected by said light intensity detection section, inserts said linear phase retarder at a predetermined azimuth different from the azimuth of said linear polarizer, switches said linear polarizer between azimuths of 0 degrees and 90 degrees, or between azimuths of 45 degrees and −45 degrees, and obtains, before and after switching, the light intensity data detected by said light intensity detection section, and calculates Stokes parameters of said converted polarized light beam based on the light intensity data.

4. An exposure apparatus according to claim 1, wherein said parameter calculation section removes said linear phase retarder from the optical path or sets said linear phase retarder at a same azimuth as said linear polarizer, sets said linear polarizer serially at an azimuth of 0 degrees and 90 degrees, obtains for each azimuth the light intensity data detected by said light intensity detection section, and calculates $s_0'$ and $s_0'$ of Stokes parameters ($s_0'$, $s_1'$, $s_2'$, and $s_3'$) of said converted polarized light beam based on the light intensity data, removes said linear phase retarder from the optical path or sets said linear phase retarder at a same azimuth as said linear polarizer, sets said linear polarizer serially at an azimuth of 45 degrees and −45 degrees, obtains for each azimuth the light intensity data detected by said light intensity detection section, and calculates $s_0'$ and $s_2'$ of Stokes parameters ($s_0'$, $s_1'$, $s_2'$, and $s_3'$) of said converted polarized light beam based on the light intensity data, and inserts said linear phase retarder at a predetermined azimuth different from the azimuth of said linear polarizer, switches said linear polarizer between azimuths of 0 degrees and 90 degrees, or between azimuths of 45 degrees and −45 degrees, obtains, before and after switching, the light intensity data detected by said light intensity detection section, and calculates $s_0'$ and $s_3'$ of Stokes parameters ($s_0'$, $s_1'$, $s_2'$, and $s_3'$) of said converted polarized light beam based on the light intensity data.

5. An exposure apparatus according to any one of claims 1 to 4, wherein said linear phase retarder is a quarter-wave plate.

6. An exposure apparatus according to claim 5, wherein said quarter-wave plate is, for calculation of $s_0'$ and $s_3'$ of Stokes parameters ($s_0'$, $s_1'$, $s_2'$, and $s_3'$) of said converted polarized light beam, inserted at a first azimuth and a second azimuth different from the first azimuth by 90 degrees, and said parameter calculation section obtains for each azimuth the light intensity data and calculates Stokes parameters of said converted polarized light beam.

7. An exposure apparatus according to claim 1, wherein said light flux which said light source generates is linear polarized light beam, said first polarization conversion system includes a polarization rotation element and a quarter-wave plate, and said quarter-wave plate is, for conversion of linearly polarized light beam into circularly polarized light beam, inserted at 45 degrees azimuth relative to a polarization direction of said light flux passing through said polarization rotation element, and is otherwise inserted at an azimuth matching the polarization direction of said light flux or removed from the optical path of said light flux.

8. An exposure apparatus according to claim 7, wherein said polarization rotation element is a half-wave plate which is configured to change its azimuth in 22.5 degrees increments relative to said light flux.

9. An exposure apparatus according to claim 7, wherein said polarization rotation element is a half-wave plate which can change its azimuth in 45 degrees increments relative to said light flux.

10. An exposure apparatus according to claim 7, wherein said polarization rotation element includes a depolarizing plate and a linear polarizer with a variable azimuth.

11. An exposure apparatus according to claim 1, wherein said photomask and said projection optical system can include therebetween a third polarization conversion system which includes a linear polarizer which can be set at an azimuth of 45×n degrees (n is integer) and a linear phase retarder.

12. An exposure apparatus according to claim 11, wherein said parameter calculation section switches said linear polarizer of said third polarization conversion system between a plurality of azimuths, switches said linear phase retarder of said third polarization conversion system between being inserted into and removed from the optical path or between a plurality of azimuths, and for each condition, emits from said first polarization conversion system one of two types of polarized light beams symmetric about an origin on Poincare sphere, in order to obtain a plurality of light intensity data from said light intensity detection section, and based on the plurality of light intensity data, calculates parameters of Mueller matrix of said photomask and said illumination optical system.

13. A method of measuring Mueller matrix of an optical system of an exposure apparatus in which light flux from a light source is introduced through an illumination optical system to a photomask, and an object to be exposed is exposed via a projection optical system to a mask pattern formed on the photomask, comprising:

a polarization conversion step of serially converting said light flux into a plurality of polarized light beams perpendicular to each other on Poincare sphere;

a step of injecting said polarized light beam into said illumination optical system, said photomask or said projection optical system to convert said polarized light beam into a converted polarized light beam based on Mueller matrix of said optical systems;

a switching step of inserting a linear polarizer into an optical path of said converted polarized light beam, switching the linear polarizer to a proper azimuth, inserting properly a linear phase retarder, in addition to the linear polarizer, into the optical path of said converted polarized light beam at a predetermined azimuth;

a light intensity measurement step of measuring a light intensity of said converted polarized light beam near an imaging position at which an image of said mask pattern is formed for each condition switched in said switching step;

a parameter calculation step of calculating Stokes parameters of said converted polarized light beam based on a plurality of light intensity obtained; and a Mueller Matrix calculation step of calculating Mueller Matrix of an optical system upstream of said linear polarizer or said linear phase retarder, based on the calculated Stokes parameters of said converted polarized light beam and Stokes parameters of said polarized light beam obtained in said polarization conversion step.

14. A method of measuring Mueller matrix of an optical system of an exposure apparatus according to claim 13, wherein said linear polarizer is set at an azimuth of 45×n degrees (n is integer).

15. A method of measuring Mueller matrix of an optical system of an exposure apparatus according to claim 13, wherein said switching step realizes a switching condition in which said linear phase retarder is removed from the optical path or set at a same azimuth as said linear polarizer, and said linear polarizer is switched between azimuths of 0 degrees, 90 degrees, 45 degrees, and −45 degrees, and a switching condition in which said linear phase retarder is inserted at a predetermined azimuth different from the azimuth of said linear polarizer, and said linear polarizer is switched between azimuths of 0 degrees and 90 degrees, or between azimuths of 45 degrees and −45 degrees.

16. A method of measuring Mueller matrix of an optical system of an exposure apparatus according to claim 13, wherein in said switching step, said linear phase retarder is removed from the optical path or set at a same azimuth as said linear polarizer, and said linear polarizer is set at azimuths of 0 degrees and 90 degrees, in said light intensity measurement step, light intensity data of said converted polarized light beam are obtained for each of 0 degrees and 90 degrees azimuths, and in said parameter calculation step, $s_0'$ and $s_1'$ of Stokes parameters ($s_0'$, $s_1'$, $s_2'$, and $s_3'$) of said converted polarized light beam are calculated based on the obtained light intensity data, wherein in said switching step, said linear phase retarder is removed from the optical path or set at a same azimuth as said linear polarizer, and said linear polarizer is set at azimuths of 45 degrees and −45 degrees, in said light intensity measurement step, light intensity data of said converted polarized light beam are obtained for each of 45 degrees and −45 degrees azimuths, and in said parameter calculation step, $s_0'$ and $s_2'$ of Stokes parameters ($s_0'$, $s_1'$, $s_2'$, and $s_3'$) of said converted polarized light beam are calculated based on the obtained light intensity data, and wherein in said switching step, said linear phase retarder is inserted at a predetermined azimuth different from the azimuth of said linear polarizer, and said linear polarizer is switched between azimuths of 0 degrees and 90 degrees, or between azimuths of 45 degrees and −45 degrees, in said light intensity measurement step, light intensity data of said converted polarized light beam are obtained before and after switching, and in said parameter calculation step, $s_0'$ and $s_3'$ of Stokes parameters ($s_0'$, $s_1'$, $s_2'$, and $s_3'$) of said converted polarized light beam are calculated based on the obtained light intensity data.

17. A method of measuring Mueller matrix of an optical system of an exposure apparatus according to claim 16, wherein said linear phase retarder is a quarter-wave plate, and wherein in said switching step, said quarter-wave plate is, for calculation of $s_0'$ and $s_3'$ of Stokes parameters ($s_0'$, $s_1'$, $s_2'$, and $s_3'$) of said converted polarized light beam, inserted at a first azimuth and a second azimuth different from the first azimuth by 90 degrees, and in said parameter calculation step, light intensity data are obtained for each azimuth, and Stokes parameters of said converted polarized light beam are calculated.

18. A method of measuring Mueller matrix of an optical system of an exposure apparatus according to any one of claims 13 to 16, wherein in said switching step, said linear polarizer and said linear phase retarder are inserted downstream of said photomask, and in this state, said parameter calculation step is performed to calculate a Mueller Matrix of said photomask and/or said illumination optical system.

19. A method of measuring Mueller matrix of an optical system of an exposure apparatus according to claim 18, wherein in said switching step, said linear polarizer is switched between a plurality of azimuths, and said linear phase retarder is switched between being inserted into and removed from the optical path or between a plurality of azimuths, and for each condition, in said parameter calculation step, one of two types of polarized light beams symmetric about an origin on Poincare sphere is emitted from said first polarization conversion system, to obtain a plurality of light intensity data from said light intensity detection section, and based on the plurality of light intensity data, parameters of Mueller matrix of said photomask or said illumination optical system are calculated.

* * * * *

UNITED STATES PATENT AND TRADEMARK OFFICE
CERTIFICATE OF CORRECTION

| | | |
|---|---|---|
| PATENT NO. | : 7,084,977 B2 | |
| APPLICATION NO. | : 10/959500 | |
| DATED | : August 1, 2006 | |
| INVENTOR(S) | : Nomura | |

It is certified that error appears in the above-identified patent and that said Letters Patent is hereby corrected as shown below:

Claim 4, column 25, line 49, change "$s_0'$ and $s_0'''$" to --$s_0'$ and $s_1'$--.

Change Fig. 1 to remove the arrowhead from the line connecting blocks 5 and 6.

The title page showing the illustrative figure should be deleted and substitute with the attached title page.

The drawing sheet, consisting of Fig. 1, shoud be deleeted and replaced with drawing sheet, consisting of Fig. 1, as shown on the attached page.

Signed and Sealed this

Twenty-first Day of August, 2007

JON W. DUDAS
*Director of the United States Patent and Trademark Office*

(12) United States Patent
Nomura

(10) Patent No.: US 7,084,977 B2
(45) Date of Patent: Aug. 1, 2006

(54) EXPOSURE APPARATUS AND METHOD OF MEASURING MUELLER MATRIX OF OPTICAL SYSTEM OF EXPOSURE APPARATUS

(75) Inventor: Hiroshi Nomura, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 46 days.

(21) Appl. No.: 10/959,500

(22) Filed: Oct. 7, 2004

(65) Prior Publication Data
US 2005/0105087 A1 May 19, 2005

(30) Foreign Application Priority Data
Oct. 7, 2003 (JP) .............................. 2003-348131

(51) Int. Cl.
*G01J 4/00* (2006.01)

(52) U.S. Cl. ................................................ 356/364

(58) Field of Classification Search .............. None
See application file for complete search history.

(56) References Cited

U.S. PATENT DOCUMENTS

| | | | |
|---|---|---|---|
| 5,072,126 A * | 12/1991 | Progler | 250/548 |
| 6,208,415 B1 | 3/2001 | De Boer et al. | |
| 6,266,141 B1 * | 7/2001 | Morita | 356/365 |
| 6,473,179 B1 | 10/2002 | Wang et al. | |
| 6,844,972 B1 * | 1/2005 | McGuire, Jr. | 359/494 |

* cited by examiner

*Primary Examiner*—Tu T. Nguyen
(74) *Attorney, Agent, or Firm*—Finnegan, Henderson, Farabow, Garrett & Dunner, L.L.P.

(57) ABSTRACT

A method is provided for measuring Mueller Matrix of an optical system of an exposure apparatus. Light flux from a light source is serially converted into any of a plurality of polarized light beams perpendicular to each other on Poincare sphere and is output. This polarized light beam is injected into a projection optical system or the like to be converted into a converted polarized light beam based on Mueller matrix of each optical system. With a linear polarizer or a linear phase retarder being properly inserted into an optical path of the converted polarized light beam, a light intensity is measured. Stokes parameters of the converted polarized light beam are calculated based on the measured light intensity.

19 Claims, 5 Drawing Sheets